US012427618B2

United States Patent
Hou et al.

(10) Patent No.: US 12,427,618 B2
(45) Date of Patent: Sep. 30, 2025

(54) CHEMICAL-MECHANICAL PLANARIZATION PAD AND METHODS OF USE

(71) Applicant: Taiwan Semiconductor Manufacturing Company, Ltd., Hsinchu (TW)

(72) Inventors: Te-Chien Hou, Kaohsiung (TW); Chih Hung Chen, Hsinchu (TW); Shich-Chang Suen, Hsinchu (TW); Liang-Guang Chen, Hsinchu (TW); Wen-Pin Liao, Hsinchu (TW); Kei-Wei Chen, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 522 days.

(21) Appl. No.: 17/453,302

(22) Filed: Nov. 2, 2021

(65) Prior Publication Data
US 2023/0021149 A1    Jan. 19, 2023

Related U.S. Application Data

(60) Provisional application No. 63/222,676, filed on Jul. 16, 2021.

(51) Int. Cl.
*B24B 37/26* (2012.01)
*H01L 21/306* (2006.01)
*H01L 21/321* (2006.01)

(52) U.S. Cl.
CPC ........ *B24B 37/26* (2013.01); *H01L 21/30625* (2013.01); *H01L 21/3212* (2013.01)

(58) Field of Classification Search
CPC .................. B24B 37/042; B24B 37/20–26
USPC ............. 451/41, 283, 287, 527, 532, 539
See application file for complete search history.

(56) References Cited

U.S. PATENT DOCUMENTS

| | | | | |
|---|---|---|---|---|
| 5,882,251 | A * | 3/1999 | Berman | B24B 37/26 451/527 |
| 7,070,480 | B2 * | 7/2006 | Moon | B24B 37/26 451/36 |
| 8,870,626 | B2 * | 10/2014 | Wang | B24B 37/30 451/286 |
| 10,201,887 | B2 * | 2/2019 | Chen | B24B 37/30 |
| 11,534,888 | B2 * | 12/2022 | Yun | B24B 37/26 |
| 11,813,714 | B2 * | 11/2023 | Kim | B24B 37/26 |

(Continued)

FOREIGN PATENT DOCUMENTS

WO    WO-2006003697 A1 *    1/2006    ............. B24B 37/26

OTHER PUBLICATIONS

Machine translation of WO-2006003697-A1 (Year: 2006).*

*Primary Examiner* — Robert F Neibaur
(74) *Attorney, Agent, or Firm* — Harrity & Harrity, LLP

(57) ABSTRACT

Some implementations described herein relate to dispensing a slurry onto a polishing pad for a chemical-mechanical planarization (CMP) process. These implementations also involve rotating the polishing pad while the slurry is dispensed onto the polishing pad. Rotation of the polishing pad results in a traversal of the slurry radially outward toward a polishing pad outer edge of the polishing pad. The polishing pad includes a plurality of groove segments and a geometric patterns formed by the plurality of the groove segments impede the flow of the slurry to the polishing pad outer edge.

20 Claims, 20 Drawing Sheets

(56) References Cited

U.S. PATENT DOCUMENTS

2020/0061773 A1\* 2/2020 Kojima .................. B24B 37/26
2022/0226962 A1\* 7/2022 Kato .................... B24B 53/017

\* cited by examiner

CHEMICAL-MECHANICAL PLANARIZATION PAD AND METHODS OF USE

CROSS-REFERENCE TO RELATED APPLICATION

This patent application claims priority to U.S. Provisional Patent Application No. 63/222,676, filed on Jul. 16, 2021, and entitled "PAD FOR CHEMICAL MECHANICAL POLISHING/PLANARIZATION." The disclosure of the prior application is considered part of and is incorporated by reference into this patent application.

BACKGROUND

A layer, a substrate, or a semiconductor wafer may be planarized using a polishing or planarizing technique such as chemical mechanical polishing/planarization (CMP). A CMP process may include depositing a slurry (or polishing compound) onto a polishing pad. A semiconductor wafer may be mounted to and secured by a carrier, which may rotate the semiconductor wafer as the semiconductor wafer is pressed against the polishing pad. The slurry and polishing pad act as an abrasive that polishes or planarizes one or more layers (e.g., metallization layers) of the semiconductor wafer as the semiconductor wafer is rotated. The polishing pad may also be rotated to ensure a continuous supply of slurry is applied to the polishing pad.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
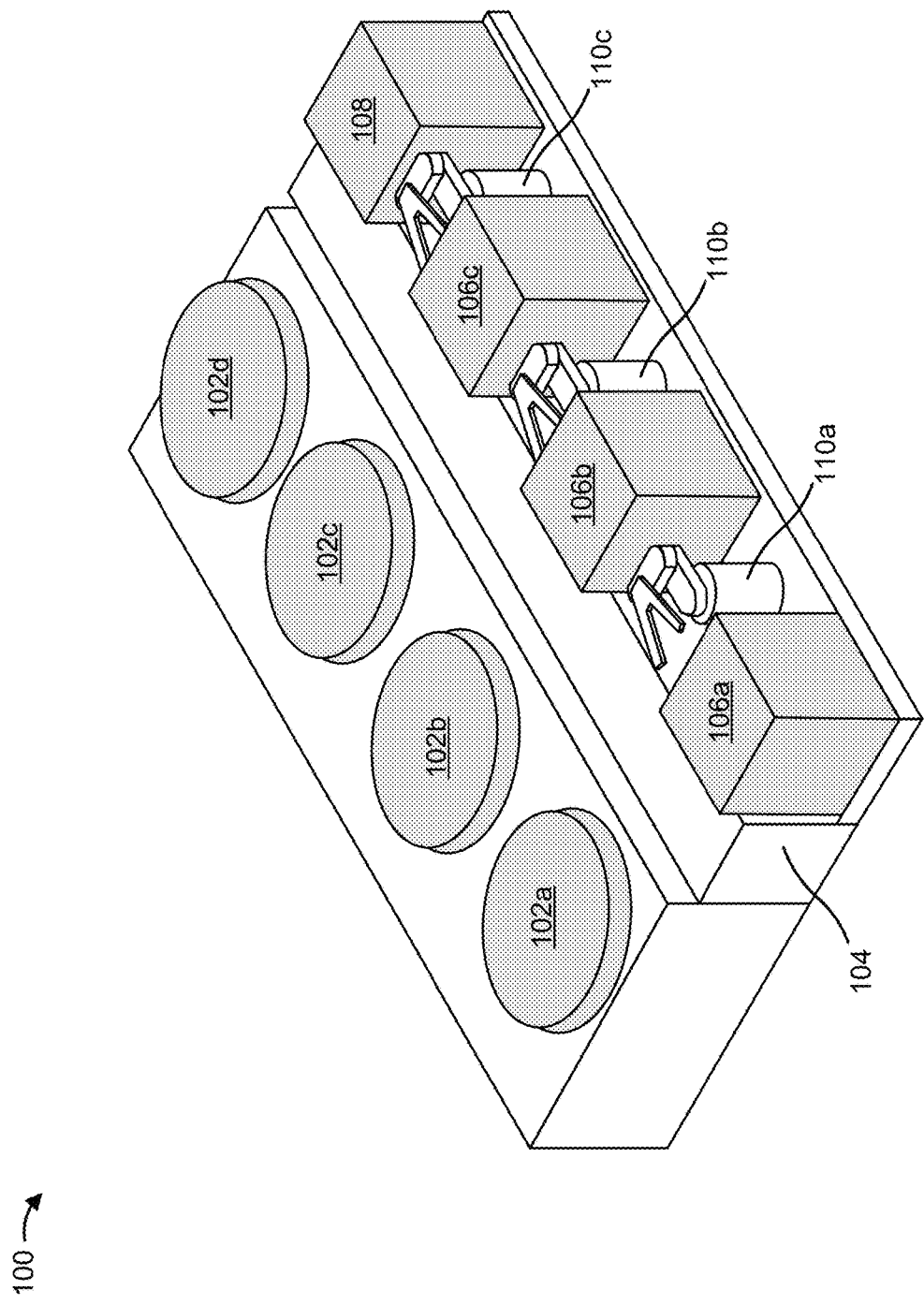
FIG. 1 is a diagram of an example chemical mechanical polishing/planarization (CMP) system described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor wafer may be logically separated into a plurality of concentric zones. Each zone may be referred to as a within zone (WiZ) or as another type of zone. The zones provide a manner for tracking thickness uniformity across the semiconductor wafer (e.g., radial uniformity between a center of the semiconductor wafer and an edge of the semiconductor wafer). As semiconductor manufacturing nodes advance (e.g., photolithography patterning linewidths reduce and integrated circuit device features on a semiconductor wafer become smaller), the thickness uniformity across the zones of the semiconductor wafer may have an increasing impact on semiconductor device performance and quality. In particular, as semiconductor device sizes continue to shrink, semiconductor devices on the semiconductor wafer become more susceptible to smaller variations in zone thickness across the semiconductor wafer. Polishing pads used as part of a chemical mechanical polishing/planarization (CMP) process, in some instances, include grooves that result in a non-uniform flow of the slurry (e.g., a non-uniform or uneven transport of the slurry) during the polishing of the semiconductor wafer. A non-uniform flow of slurry may result in a zone thickness of the semiconductor wafer that fails to satisfy a uniformity threshold. A non-uniform zone thickness may introduce defects that negatively impact yield and electrical performance of integrated circuit devices on the semiconductor wafer.

Some implementations described herein include CMP techniques and apparatuses that include and/or use polishing pads having various geometric patterns formed by groove segments (e.g., polygons and/or non-polygons). The geometric patterns formed by the groove segments promote a uniform flow of slurry during a CMP process of a semiconductor wafer. The geometric patterns formed by the groove segments are made up of a plurality groove segments. As described herein, all or a portion of the groove segments are configured so that all or a portion of the groove segments impede, resist, and/or slow radial flow of slurry on the polishing pad. By impeding the radial flow of slurry, the slurry is retained on the polishing pad for a longer time-duration and/or a greater amount of slurry is retained on the polishing pad in the CMP process. Such an increase in the retention time and/or retention amount of the slurry results in reduced slurry consumption and, therefore, lower operating costs. Further, the uniform flow of the slurry increases thickness uniformity across the semiconductor wafer (e.g., such that the thickness uniformity across the semiconductor wafer satisfies a uniformity threshold), which reduces or eliminates defects, increases yield, and/or increases electrical performance of integrated circuit devices on the semiconductor wafer.

FIG. 1 is a diagram of an example of a CMP system 100 described herein. The CMP system 100 includes a semiconductor processing tool that is configured to polish or planarize a semiconductor wafer, a semiconductor device, and/or another type of semiconductor substrate. The CMP system 100 includes one or more processing chambers 102 (shown in FIG. 1 as processing chambers 102a-102d) in which layers and/or structures of a semiconductor wafer are polished or planarized. In some implementations, a processing chamber 102 is configured to polish or planarize a surface (or a layer or structure) of a semiconductor wafer with a combination of chemical and mechanical forces (e.g., chemical etching and free abrasive polishing). The CMP system 100 is configured to utilize an abrasive and corrosive chemical slurry in conjunction with a polishing pad in a processing chamber 102. To perform a CMP process, the CMP system 100 presses the polishing pad against the semiconductor wafer in the processing chamber 102 using a dynamic polishing head. The dynamic polishing head may rotate with different axes of rotation to remove material and even-out any irregular topography of a layer or a structure of the semiconductor wafer, thereby making the layer or the structure of the semiconductor wafer flat or planar.

The CMP system 100 includes a transfer chamber 104 in which semiconductor wafers are transferred to and from the processing chambers 102. Moreover, semiconductor wafers are transferred between the transfer chamber 104 and one or more cleaning chambers 106 (shown in FIG. 1 as cleaning chambers 106a-106c) included in the CMP system 100. A cleaning chamber 106 (also referred to as a CMP cleaning chamber or a post-CMP cleaning chamber) is a component of the CMP system 100 that is configured to perform a post-CMP cleaning operation to clean or remove residual slurry and/or removed material from a semiconductor wafer that has undergone the CMP process.

The CMP system 100 includes a rinsing chamber 108 that is configured to rinse a semiconductor wafer after one or more post-CMP cleaning operations. The rinsing chamber 108 rinses a semiconductor wafer to remove residual cleaning agent from the semiconductor wafer.

The CMP system 100 includes a plurality of transport devices 110 (shown in FIG. 1 as transport devices 110a-110c). The transport devices 110 include robot arms or other types of transport devices that are configured to transfer semiconductor wafers between the processing chambers 102, the transfer chamber 104, the cleaning chamber 106, and/or the rinsing chamber 108.

As indicated above, FIG. 1 is provided as an example. Other examples may differ from what is described with regard to FIG. 1. For example, the number of processing chambers 102, cleaning chambers 106, and transport devices 110 shown in FIG. 1 are intended as examples. Other examples may include a different number of processing chambers 102, cleaning chambers 106, and/or transport devices 110.

Figure 2A:
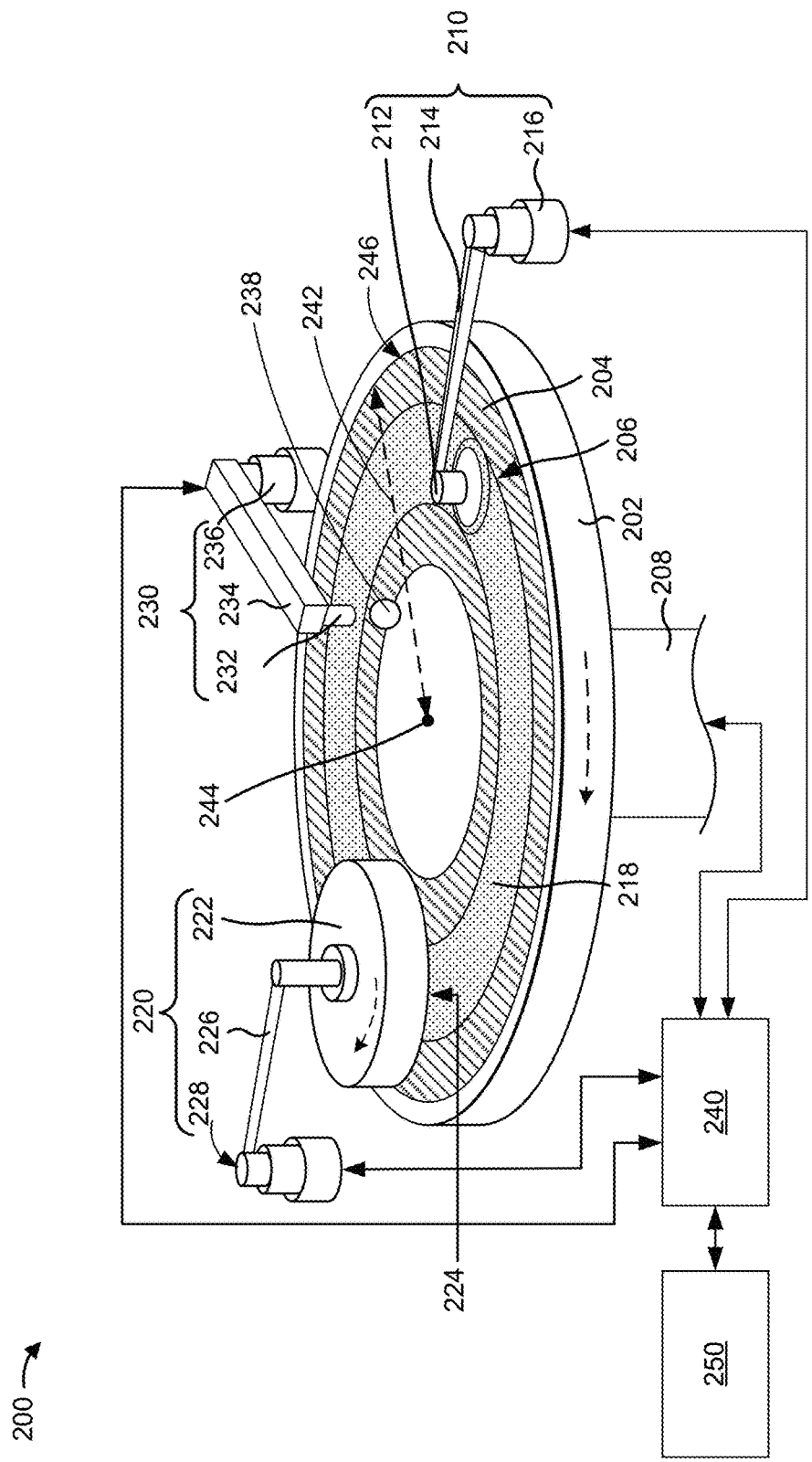
FIG. 2A is a diagram of a perspective view of a portion of an example of a CMP tool of the CMP system of FIG. 1 for performing a planarization process.
Figure 2B:
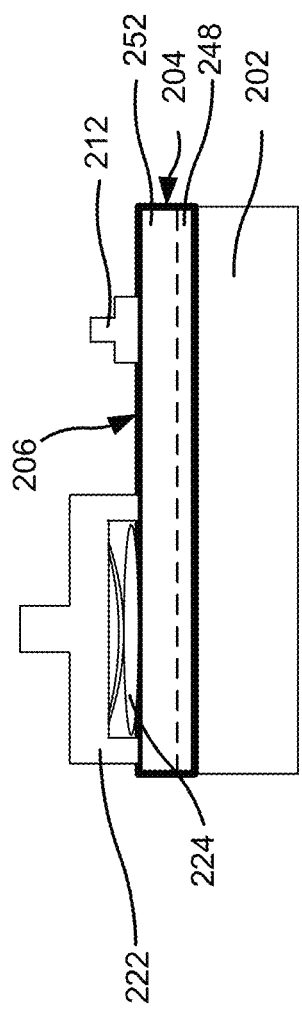
FIG. 2B is a diagram of a cross-sectional view of a portion of an example of a CMP tool of the CMP system of FIG. 1 for performing a planarization process.

FIGS. 2A and 2B are diagrams of an example of a CMP tool 200 described herein. FIG. 2A illustrates a perspective view of the CMP tool 200 described herein for performing a CMP process in the CMP system 100 of FIG. 1. FIG. 2B is a cross-sectional view of the CMP tool 200 described herein for performing a CMP process in the CMP system 100 of FIG. 1. The CMP tool 200 corresponds to components of a processing chamber 102 of the CMP system 100. FIGS. 2A and 2B illustrate views inside the processing chamber 102.

As shown in FIG. 2A, the CMP tool 200 includes various subsystems including a conditioner 210, a wafer carrier 220, a slurry system 230, a motor assembly 240, and a CMP controller 250. The CMP tool 200 further includes a rotating platen 202 and a polishing pad 204. The polishing pad 204 is mounted on the rotating platen 202 and has a polishing surface 206. The rotating platen 202 is further coupled to a drive shaft 208.

The conditioner 210 includes a conditioning disk 212 which can be pivoted via an arm 214. The arm 214 is electrically connected to the motor assembly 240 through a shaft 216. The arm 214 is driven by the shaft 216 to move, for example, in a swing motion over a range 218 during the CMP process. Therefore, the conditioning disk 212 travels along the swing motion to condition different portions of the polishing surface 206. The conditioning disk 212 may be configured to rotate about an axis to restore asperities to the polishing surface 206 as the CMP process makes the polishing surface 206 smoother. That is, in order to retain the material removal qualities of the polishing pad 204, the conditioning disk 212 is used to maintain roughness on the polishing surface 206 that would otherwise be lost during the CMP process. The conditioning disk 212 carries an abrasive pad that may include, for example, a diamond abrasive.

The wafer carrier 220 includes a polishing head 222 for mounting and securing a semiconductor wafer 224. The semiconductor wafer 224 may be mounted and secured to the polishing head 222 by a vacuum force or another type of securing force. The semiconductor wafer 224 is mounted to the polishing head 222 such that a surface of the semiconductor wafer 224 (e.g., a polishing surface, a processing surface, an active surface, a device surface) that is to be processed is orientated to face the polishing surface 206. The polishing head 222 may also be pivoted via an arm 226. The arm 226 is electrically connected to the motor assembly 240 through a shaft 228. In some implementations, the arm 226 may also be driven by the shaft 228 to move in a swing motion during the CMP process. The polishing head 222 is configured to rotate about an axis of the polishing head 222 (e.g., an axis that is approximately perpendicular to the polishing surface 206) during the CMP process.

The slurry system 230 includes a slurry supply 232 which can be pivoted via an arm 234. The arm 234 is electrically connected to the motor assembly 240 through a shaft 236. In some implementations, the arm 234 may also be driven by the shaft 236 to move in a swing motion during the CMP process. The slurry system 230 can provide slurry 238 which may include an abrasive compound and a fluid such as deionized water, or a liquid cleaner such as potassium hydroxide (KOH), onto the polishing surface 206 of the polishing pad 204 before wafer planarization occurs. In an example, a flow rate of the slurry 238 may be in a range of approximately 50 milliliters (ml)/minute to approximately 350 ml/minute.

During the CMP processing, the motor assembly 240 rotates the platen 202 and the polishing pad 204 via the drive shaft 208. The slurry system 230 dispenses the slurry 238 onto the polishing surface 206. As the polishing pad 204 rotates, the conditioning disk 212 is rotated about a disk axis of the conditioning disk 212 and is driven to swing horizontally above the polishing surface 206 such that the conditioning disk 212 can condition the polishing surface 206 of the polishing pad 204. In some implementations, the conditioning disk 212 iteratively conditions the inner portions and the outer portions of the polishing surface 206. The motor assembly 240 also rotates a semiconductor wafer 224, mounted and secured by the wafer carrier 220, through the arm 226 and the shaft 228. A down-force is controlled by the CMP controller 250 to move the active surface of the semiconductor wafer 224 onto the polishing surface 206. In this configuration, the conditioning disk 212 scratches or roughs up the polishing surface 206 of the polishing pad 204 continuously during the CMP process to promote consistent uniform planarization. The combination of motions of the conditioner 210, the wafer carrier 220, and the slurry system 230 planarizes the active surface of the semiconductor wafer 224 until an endpoint for the CMP process is reached, which may include a particular time duration of the CMP process, a particular amount of material removed from the semiconductor wafer 224, or another endpoint.

In some implementations, the polishing surface 206 includes a plurality of groove segments and/or geometric patterns formed by the plurality of groove segments configured in a groove region 242 of the polishing pad 204. During the CMP process, all or a portion of the plurality of groove segments and/or geometric patterns formed by the plurality of groove segments impede a trajectory of the slurry (hereinafter referred to as a slurry trajectory). Specifically, all or a portion of the plurality of groove segments and/or geometric patterns formed by the plurality of groove segments are configured to impede a radial flow of the slurry 238 from a center 244 of the polishing pad 204 (or from an area of the polishing pad 204 in which the slurry 238 is dispensed) to a polishing pad outer edge 246. Impeding the slurry trajectory promotes retention of the slurry 238 on the polishing surface 206 of the polishing pad 204. By impeding the slurry trajectory, a retention time or duration of time the slurry is present on the polishing pad is increased. Increasing the retention of the slurry results in a more predictable and controlled CMP process and reduces slurry waste.

In some implementations, the slurry 238 is dispensed onto the groove region 242 of the polishing pad 204. The rotation of the polishing pad 204 creates forces that direct the slurry 238 toward the polishing pad outer edge 246. The geometric patterns formed by the plurality of groove segments in the groove region 242 of the polishing pad 204 alters the slurry trajectory across the polishing pad 204. As described herein, all or a portion of the plurality of groove segments and/or geometric patterns formed by the plurality of groove segments are configured to increase a retention time or duration of time the slurry 238 is present on the polishing pad 204.

As shown in FIG. 2B, the polishing pad 204 may include a pad base 248 and a groove layer 252. In some implementations, groove layer 252 may be supported by the pad base 248, which may be formed integrally with groove layer 252 or may be formed separately from the groove layer 252. The polishing pad 204 may have a circular disk shape with the polishing surface 206 formed thereon. The groove layer 252 includes the polishing surface 206 thereon. The groove layer 252 may be formed from any material suitable for polishing an article to be polished, such as a semiconductor wafer 224. Examples of materials for polishing groove layer 252 include various polymer plastics, such as a polyurethane, polybutadiene, polycarbonate and polymethylacrylate, among other examples.

Each of the plurality of groove segments and geometric patterns formed by the plurality of groove segments may be formed in groove layer 252 in any suitable manner, such as by milling, molding, etching, among other examples. The plurality of groove segments may be formed to include specific cross-sectional profiles. In some implementations, each of the plurality of groove segments may have a consistent cross-sectional profile, such as a generally rectangular cross-sectional profile, a generally triangular cross-sectional profile, a semi-circular cross-sectional profile, a semi-oval cross-sectional profile, among other examples. In some implementations, one or more of the plurality of groove segments may have a cross-sectional profile that is different from a cross-sectional profile of another one or more of the plurality of groove segments. Examples of various cross-sectional profiles are further described herein.

As indicated above, FIGS. 2A and 2B are provided as examples. Other examples may differ from what is described with regard to FIGS. 2A and 2B.

FIGS. 3A-3C and FIGS. 4A-4D are diagrams of example implementations of polishing pads 204 as described herein. For clarity and brevity, the implementations of FIGS. 3A-3C and FIGS. 4A-4D illustrate top views of the groove region of the respective examples of the polishing pad. The various polishing pads described herein improve management of a slurry trajectory across the polishing pad 204 during the CMP process. Improved slurry management during the CMP process may extend the WiZ to a larger radius on the semiconductor wafer.

Figure 3A:
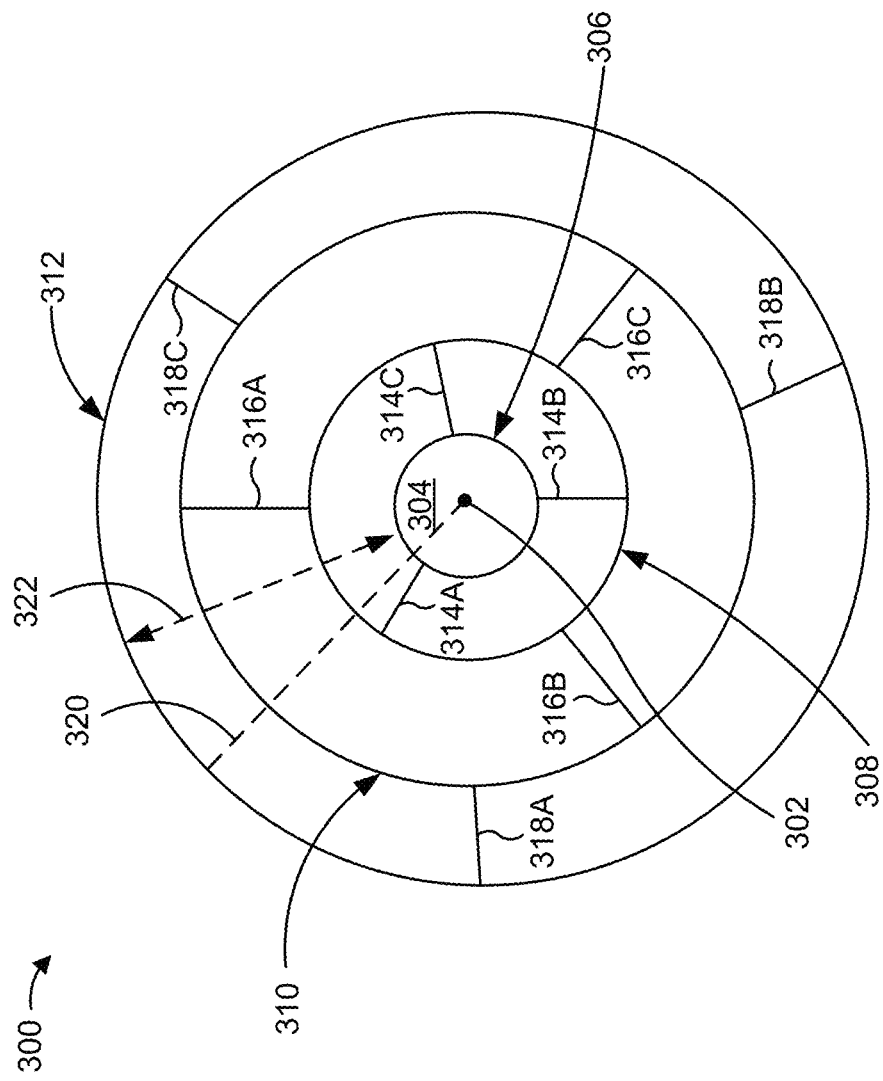
FIGS. 3A-3C are diagrams of example implementations of polishing pads as described herein.
Figure 3B:
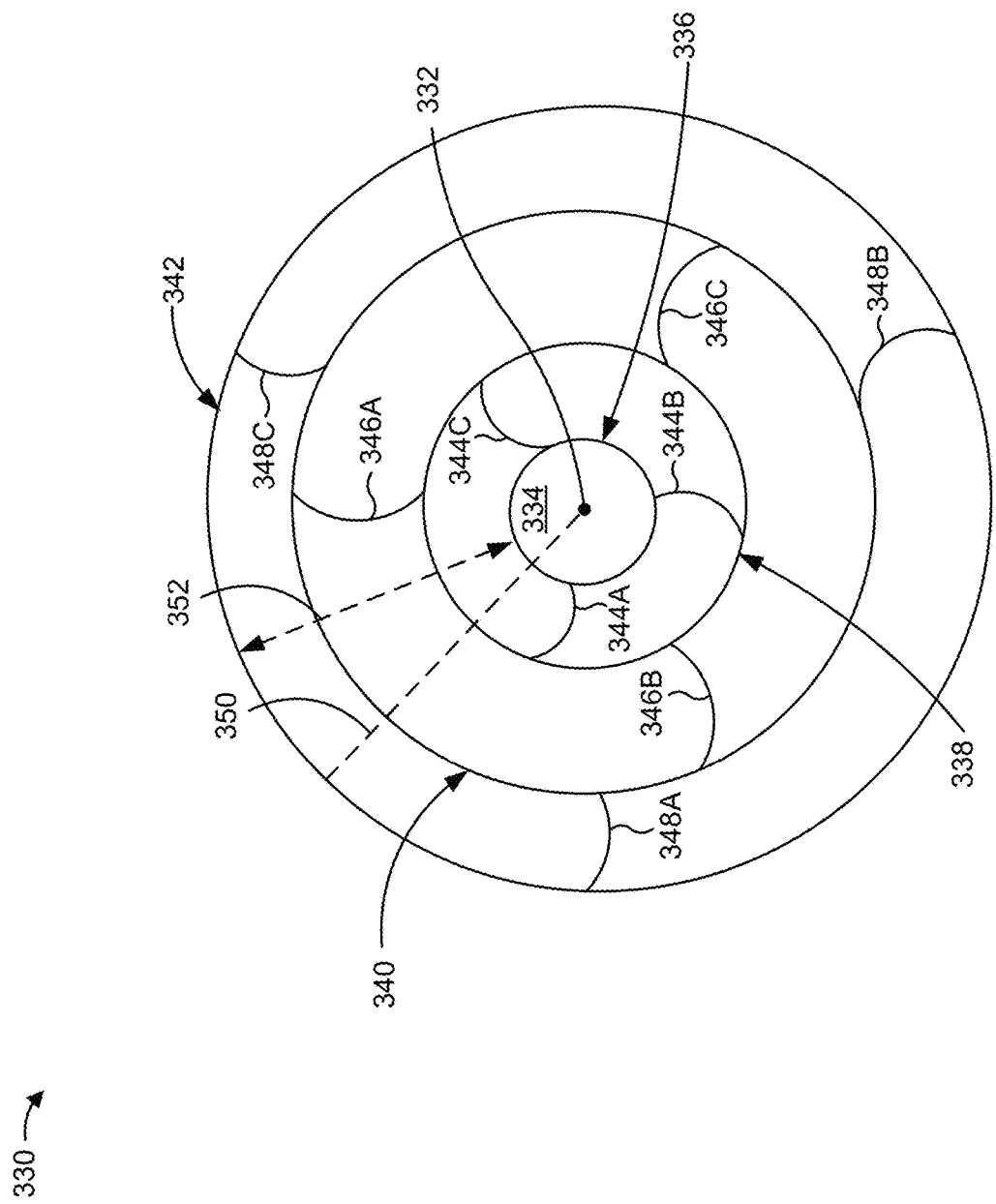
Figure 3C:
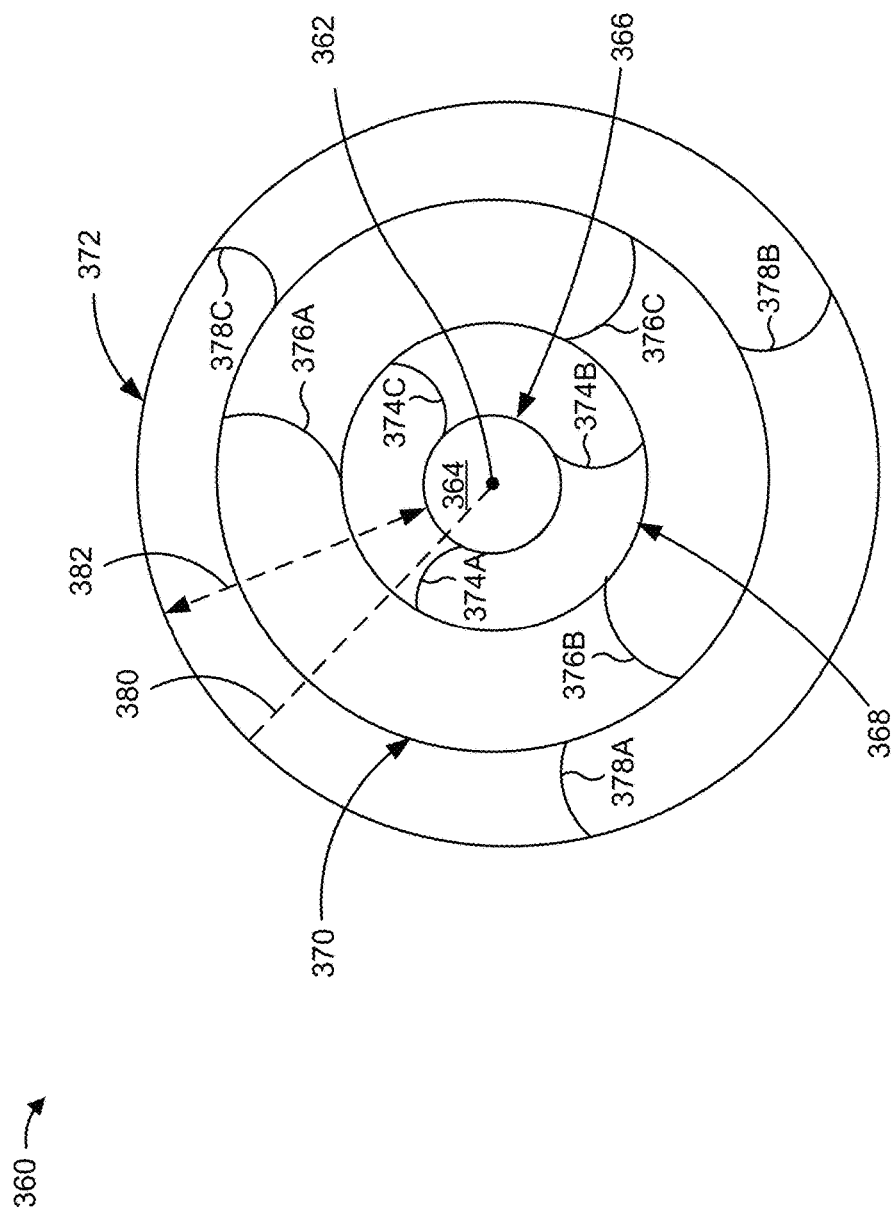

FIGS. 3A-3C are diagrams of example implementations of a polishing pad that includes an arrangement of groove segments. In some implementations, the arrangement of groove segments is configured to include radial groove segments extending substantially outward from a center (e.g., center point or center region) and located between concentric groove segments.

As shown in FIG. 3A, a polishing pad 300 (e.g., the polishing pad 204) includes a plurality of radial groove segments separated by a plurality of concentric groove segments. In some implementations, the polishing pad 300 includes a center 302 (e.g., the center 244) surrounded by a center region 304. In some implementations, the center region 304 may be bounded by a first concentric groove segment 306. The first concentric groove segment 306 is configured to be substantially orthogonal to the center 302 of the polishing pad 300. The first concentric groove segment 306 impedes a radial flow of slurry 238 during the CMP process. In some implementations, the first concentric groove segment 306 may include any of the cross-sectional profiles as described herein.

In some implementations, the polishing pad 300 further includes a second concentric groove segment 308. The second concentric groove segment 308 is configured to be substantially orthogonal to the center 302 of the polishing pad 300. The second concentric groove segment 308 impedes a radial flow of slurry 238 during the CMP process. Further, the second concentric groove segment 308 is located radially outside of the first concentric groove segment 306. In some implementations, the second concentric groove segment 308 may include any of the cross-sectional profiles as described herein. In some implementations, the cross-sectional profile of the second concentric groove segment 308 may be the same as the cross-sectional profiles of other concentric groove segments described herein. Maintaining the same cross-sectional profile for all concentric groove segments may reduce costs associated with manufacturing the polishing pad 300. In some implementations, the cross-sectional profile of the second concentric groove segment 308 may be different than the cross-sectional profile of one or more other concentric groove segments described herein. Forming different cross-sectional profiles for different concentric groove segments on the polishing pad 300 facilitates tailored control of the slurry trajectory.

In some implementations, the polishing pad 300 further includes a third concentric groove segment 310. The third concentric groove segment 310 is configured to be substantially orthogonal to the center 302 of the polishing pad 300. The third concentric groove segment 310 impedes a radial flow of slurry 238 during the CMP process. Further, the third concentric groove segment 310 is located radially outside of the first concentric groove segment 306 and radially outside of the second concentric groove segment 308. In some implementations, the third concentric groove segment 310 may include any of the cross-sectional profiles as described herein. In some implementations, the cross-sectional profile of the third concentric groove segment 310 may be the same as the cross-sectional profiles of other concentric groove segments described herein. Maintaining the same cross-sectional profile for all concentric groove segments may reduce costs associated with manufacturing the polishing pad 300. In some implementations, the cross-sectional profile of the third concentric groove segment 310 may be different than the cross-sectional profile of one or more other concentric groove segments described herein. Forming different cross-sectional profiles for different concentric groove segments on the polishing pad 300 facilitates tailored control of the slurry trajectory.

While the concentric groove segments are illustrated to include three individual concentric groove segments (e.g., the first concentric groove segment 306, the second concentric groove segment 308, and the third concentric groove segment 310), different quantities of greater or fewer concentric groove segments are within the scope of the present disclosure. In some implementations, two or more adjacent concentric groove segments (e.g., the first concentric groove segment 306, the second concentric groove segment 308, or the third concentric groove segment 310) may be spaced on the polishing pad 300 equally relative to two or more other adjacent concentric groove segments. In some implementations, two or more adjacent concentric groove segments (e.g., the first concentric groove segment 306, the second concentric groove segment 308, or the third concentric groove segment 310) may be spaced on the polishing pad 300 differently than two or more other adjacent concentric groove segments.

In some implementations, the polishing pad 300 further includes a polishing pad outer edge 312 (e.g., the polishing pad outer edge 246). The polishing pad outer edge 312 is a terminal edge of the polishing pad 300. During the CMP process, the slurry 238 radially traverses the polishing pad 300 along the slurry trajectory toward the polishing pad outer edge 312.

In some implementations, the polishing pad 300 includes a first plurality of radial groove segments 314A-314C. The first plurality of radial groove segments 314A-314C radially span between and join together with the first concentric groove segment 306 and the second concentric groove segment 308. In some implementations, the first plurality of radial groove segments 314A-314C are configured in a straight-line in a direction substantially pointing toward the center 302 of the polishing pad 300. In some implementations, the first plurality of radial groove segments 314A-314C are configured in a straight-line in a direction angularly offset from substantially pointing toward the center 302 of the polishing pad 300. In some implementations, one or more of the first plurality of radial groove segments 314A-314C are configured in a straight-line in a direction substantially pointing toward the center 302 of the polishing pad 300 and one or more of the first plurality of radial groove segments 314A-314C are configured in a straight-line in a direction angularly offset from substantially pointing toward the center 302 of the polishing pad 300. In some implementations, the first plurality of radial groove segments 314A-314C may include any of the cross-sectional profiles as described herein. In some implementations, the cross-sectional profile of the first plurality of radial groove segments 314A-314C may be the same as the cross-sectional profiles of other radial groove segments described herein. Maintaining the same cross-sectional profile for all radial groove segments may reduce costs associated with manufacturing the polishing pad 300. In some implementations, the cross-sectional profile of the first plurality of radial groove segments 314A-314C may be different than the cross-sectional profile of one or more other radial groove segments described herein. Forming different cross-sectional profiles for different radial groove segments on the polishing pad 300 facilitates tailored control of the slurry trajectory. While the first plurality of radial groove segments are illustrated to include three individual groove segments, different quantities of greater or fewer radial groove segments are within the scope of the present disclosure.

In some implementations, the polishing pad 300 includes a second plurality of radial groove segments 316A-316C. The second plurality of radial groove segments 316A-316C radially span between and join together with the second concentric groove segment 308 and the third concentric groove segment 310. In some implementations, the second plurality of radial groove segments 316A-316C are configured in a straight-line in a direction substantially pointing toward the center 302 of the polishing pad 300. In some implementations, the second plurality of radial groove segments 316A-316C are configured in a straight-line in a direction angularly offset from substantially pointing toward the center 302 of the polishing pad 300. In some implementations, one or more of the second plurality of radial groove segments 316A-316C are configured in a straight-line in a direction substantially pointing toward the center 302 of the polishing pad 300 and one or more of the second plurality of radial groove segments 316A-316C are configured in a straight-line in a direction angularly offset from substantially pointing toward the center 302 of the polishing pad 300. In some implementations, the second plurality of radial groove segments 316A-316C may include any of the cross-sectional profiles as described herein. In some implementations, the cross-sectional profile of the second plurality of radial groove segments 316A-316C may be the same as the cross-sectional profiles of other radial groove segments described herein. Maintaining the same cross-sectional profile for all radial groove segments may reduce costs associated with manufacturing the polishing pad 300. In some implementations, the cross-sectional profile of the second plurality of radial groove segments 316A-316C may be different than the cross-sectional profile of one or more other radial groove segments described herein. Forming different cross-sectional profiles for different radial groove segments on the polishing pad 300 facilitates tailored control of the slurry trajectory. While the second plurality of radial groove segments are illustrated to include three individual groove segments, different quantities of greater or fewer radial groove segments are within the scope of the present disclosure.

In some implementations, the polishing pad 300 includes a third plurality of radial groove segments 318A-318C. The third plurality of radial groove segments 318A-318C radially span between and join together with the third concentric groove segment 310 and the polishing pad outer edge 312. In some implementations, the third plurality of radial groove segments 318A-318C are configured in a straight-line in a direction substantially pointing toward the center 302 of the polishing pad 300. In some implementations, the third plurality of radial groove segments 318A-318C may be configured in a straight-line in a direction angularly offset from substantially pointing toward the center 302 of the polishing pad 300. In some implementations, one or more of the third plurality of radial groove segments 318A-318C are configured in a straight-line in a direction substantially pointing toward the center 302 of the polishing pad 300 and one or more of the third plurality of radial groove segments 318A-318C are configured in a straight-line in a direction angularly offset from substantially pointing toward the center 302 of the polishing pad 300. In some implementations, the third plurality of radial groove segments 318A-318C may include any of the cross-sectional profiles as described herein. In some implementations, the cross-sectional profile of the third plurality of radial groove segments 318A-318C may be the same as the cross-sectional profiles of other radial groove segments described herein. Maintaining the same cross-sectional profile for all radial groove segments may reduce costs associated with manufacturing the polishing pad 300. In some implementations, the cross-sectional profile of the third plurality of radial groove segments 318A-318C may be different than the cross-sectional profile of one or more other radial groove segments described herein. Forming different cross-sectional profiles for different radial groove segments on the polishing pad 300 facilitates tailored control of the slurry trajectory. While the third plurality of radial groove segments are illustrated to include three individual groove segments, different quantities of greater or fewer radial groove segments are within the scope of the present disclosure.

In some implementations, the first plurality of radial groove segments 314A-314C are radially offset or staggered (e.g., not radially aligned) from the second plurality of radial groove segments 316A-316C. Additionally, or alternatively, the second plurality of radial groove segments 316A-316C are radially offset or staggered (e.g., not radially aligned) from the third plurality of radial groove segments 318A-318C. Additionally, or alternatively, the first plurality of radial groove segments 314A-314C are radially offset or staggered (e.g., not radially aligned) from the third plurality of radial groove segments 318A-318C. Staggering of the radial groove segments impedes the slurry trajectory by preventing a straight-line path of groove segments from the center of the polishing pad to the polishing pad outer edge 312.

In some implementations, the first concentric groove segment 306, the first plurality of radial groove segments 314A-314C, the second concentric groove segment 308, the second plurality of radial groove segments 316A-316C, the third concentric groove segment 310, and the third plurality of radial groove segments 318A-318C are located along a radius 320 in a groove region 322 of the polishing pad 300.

As shown in FIG. 3B, a polishing pad 330 (e.g., the polishing pad 204) includes a plurality of radial groove segments separated by a plurality of concentric groove segments. In some implementations, the polishing pad 330 includes a center 332 (e.g., the center 244) surrounded by a center region 334. In some implementations, the center region 334 may be bounded by a first concentric groove segment 336. The first concentric groove segment 336 is configured to be substantially orthogonal to the center 332 of the polishing pad 330. The first concentric groove segment 336 impedes a radial flow of slurry 238 during a CMP process. In some implementations, the first concentric groove segment 336 may include any of the cross-sectional profiles as described herein.

In some implementations, the polishing pad 330 further includes a second concentric groove segment 338. The second concentric groove segment 338 is configured to be substantially orthogonal to the center 332 of the polishing pad 330. The second concentric groove segment 338 impedes a radial flow of slurry 238 during the CMP process. Further, the second concentric groove segment 338 is located radially outside of the first concentric groove segment 336. In some implementations, the second concentric groove segment 338 may include any of the cross-sectional profiles as described herein. In some implementations, the cross-sectional profile of the second concentric groove segment 338 may be the same as the cross-sectional profiles of other concentric groove segments described herein. Maintaining the same cross-sectional profile for all concentric groove segments may reduce costs associated with manufacturing the polishing pad 330. In some implementations, the cross-sectional profile of the second concentric groove segment 338 may be different than the cross-sectional profile of one or more other concentric groove segments described herein. Forming different cross-sectional profiles for different concentric groove segments on a polishing pad facilitates tailored control of the slurry trajectory.

In some implementations, the polishing pad 330 further includes a third concentric groove segment 340. The third concentric groove segment 340 is configured to be substantially orthogonal to the center 332 of the polishing pad 330. The third concentric groove segment 340 impedes a radial flow of slurry 238 during the CMP process. Further, the third concentric groove segment 340 is located radially outside of the first concentric groove segment 336 and radially outside of the second concentric groove segment 338. In some implementations, the third concentric groove segment 340 may include any of the cross-sectional profiles as described herein. In some implementations, the cross-sectional profile of the third concentric groove 340 may be the same as the cross-sectional profiles of other concentric groove segments described herein. Maintaining the same cross-sectional profile for all concentric groove segments may reduce costs associated with manufacturing the polishing pad 330. In some implementations, the cross-sectional profile of the third concentric groove segment 340 may be different than the cross-sectional profile of one or more other concentric groove segments described herein. Forming different cross-sectional profiles for different concentric groove segments on the polishing pad 330 facilitates tailored control of the slurry trajectory.

While the concentric groove segments are illustrated to include three individual concentric groove segments (e.g., the first concentric groove segment 336, the second concentric groove segment 338, and the third concentric groove segment 340), different quantities of greater or fewer concentric groove segments are within the scope of the present disclosure. In some implementations, two or more adjacent concentric groove segments (e.g., the first concentric groove segment 336, the second concentric groove segment 338, or the third concentric groove segment 340) may be spaced on the polishing pad 330 equally relative to two or more other adjacent concentric groove segments. In some implementations, two or more adjacent concentric groove segments (e.g., the first concentric groove segment 336, the second concentric groove segment 338, or the third concentric groove segment 340) may be spaced on the polishing pad 300 differently than two or more other adjacent concentric groove segments.

In some implementations, the polishing pad 330 further includes a polishing pad outer edge 342 (e.g., the polishing pad outer edge 246). The polishing pad outer edge 342 is a terminal edge of the polishing pad 330. During the CMP process, the slurry 238 radially traverses the polishing pad 330 along the slurry trajectory toward the polishing pad outer edge 342.

In some implementations, the polishing pad 330 includes a first plurality of radial groove segments 344A-344C. The first plurality of radial groove segments 344A-344C radially span between and join together with the first concentric groove segment 336 and the second concentric groove segment 338. In some implementations, the first plurality of radial groove segments 344A-344C are configured in a forward arc with the forward arc substantially aligned in a direction pointing toward the center 332 of the polishing pad 330. The forward arc is an arc that points in a direction consistent with the rotation of the polishing pad 330 during the CMP process. In some implementations, the first plurality of radial groove segments 344A-344C may be configured in a forward arc with the forward arc substantially aligned in a direction angularly offset from pointing toward the center 332 of the polishing pad 330. In some implementations, the first plurality of radial groove segments 344A-344C may include any of the cross-sectional profiles as described herein. In some implementations, the cross-sectional profile of the first plurality of radial groove segments 344A-344C may be the same as the cross-sectional profiles of other radial groove segments described herein. Maintaining the same cross-sectional profile for all radial groove segments may reduce costs associated with manufacturing the polishing pad 330. In some implementations, the cross-sectional profile of the first plurality of radial groove segments 344A-344C may be different than the cross-sectional profile of one or more other radial groove segments described herein. Forming different cross-sectional profiles for different radial groove segments on the polishing pad 330 facilitates tailored control of the slurry trajectory. While the first plurality of radial groove segments are illustrated to include three individual groove segments, different quantities of greater or fewer radial groove segments are within the scope of the present disclosure.

In some implementations, the polishing pad 330 includes a second plurality of radial groove segments 346A-346C. The second plurality of radial groove segments 346A-346C radially span between and join together with the second concentric groove segment 338 and the third concentric groove segment 340. In some implementations, the second plurality of radial groove segments 346A-346C are configured in a forward arc with the forward arc substantially aligned in a direction pointing toward the center 332 of the polishing pad 330. In some implementations, the second plurality of radial groove segments 346A-346C may be configured in a forward arc with the forward arc substantially aligned in a direction angularly offset from pointing toward the center 332 of the polishing pad 330. In some implementations, the second plurality of radial groove segments 346A-346C may include any of the cross-sectional profiles as described herein. In some implementations, the cross-sectional profile of the second plurality of radial groove segments 346A-346C may be the same as the cross-sectional profiles of other radial groove segments described herein. Maintaining the same cross-sectional profile for all radial groove segments may reduce costs associated with manufacturing the polishing pad 330. In some implementations, the cross-sectional profile of the second plurality of radial groove segments 346A-346C may be different than the cross-sectional profile of one or more other radial groove segments described herein. Forming different cross-sectional profiles for different radial groove segments on the polishing pad 330 facilitates tailored control of the slurry trajectory. While the second plurality of radial groove segments are illustrated to include three individual groove segments, different quantities of greater or fewer radial groove segments are within the scope of the present disclosure.

In some implementations, the polishing pad 330 includes a third plurality of radial groove segments 348A-348C. The third plurality of radial groove segments 348A-348C radially span between and join together with the third concentric groove segment 340 and the polishing pad outer edge 342. In some implementations, the third plurality of radial groove segments 348A-348C are configured in a forward arc with the forward arc substantially aligned in a direction pointing toward the center 332 of the polishing pad 330. In some implementations, the third plurality of radial groove segments 348A-348C may be configured in a forward arc with the forward arc substantially aligned in a direction angularly offset from pointing toward the center 332 of the polishing pad 330. In some implementations, the third plurality of radial groove segments 348A-348C may include any of the cross-sectional profiles as described herein. In some implementations, the cross-sectional profile of the third plurality of radial groove segments 348A-348C may be the same as the cross-sectional profiles of other radial groove segments described herein. Maintaining the same cross-sectional profile for all radial groove segments may reduce costs associated with manufacturing the polishing pad 330. In some implementations, the cross-sectional profile of the third plurality of radial groove segments 348A-348C may be different than the cross-sectional profile of one or more other radial groove segments described herein. Forming different cross-sectional profiles for different radial groove segments on the polishing pad 330 facilitates tailored control of the slurry trajectory. While the third plurality of radial groove segments are illustrated to include three individual groove segments, different quantities of greater or fewer radial groove segments are within the scope of the present disclosure.

In some implementations, the first plurality of radial groove segments 344A-344C are radially offset or staggered (e.g., not radially aligned) from the second plurality of radial groove segments 346A-346C. Additionally, or alternatively, the second plurality of radial groove segments 346A-346C are radially offset or staggered (e.g., not radially aligned) from the third plurality of radial groove segments 348A-348C. Additionally, or alternatively, the first plurality of radial groove segments 344A-344C are radially offset or staggered (e.g., not radially aligned) from the third plurality of radial groove segments 348A-348C. Staggering of the radial groove segments impedes the slurry trajectory by preventing a straight-line path of groove segments from the center of the polishing pad to the polishing pad outer edge 342.

In some implementations, the first concentric groove segment 336, the first plurality of radial groove segments 344A-344C, the second concentric groove segment 338, the second plurality of radial groove segments 346A-346C, the third concentric groove segment 340, and the third plurality of radial groove segments 348A-348C are located along a radius 350 in a groove region 352 of the polishing pad 330.

As shown in FIG. 3C, a polishing pad 360 (e.g., the polishing pad 204) includes a plurality of radial groove segments separated by a plurality of concentric groove segments. In some implementations, the polishing pad 360 includes a center 362 (e.g., the center 244) surrounded by a center region 364. In some implementations, the center region 364 may be bounded by a first concentric groove segment 366. The first concentric groove segment 366 is configured to be substantially orthogonal to the center 362 of the polishing pad 360. The first concentric groove segment 366 impedes a radial flow of slurry 238 during a CMP process. In some implementations, the first concentric groove segment 366 may include any of the cross-sectional profiles as described herein.

In some implementations, the polishing pad 360 further includes a second concentric groove segment 368. The second concentric groove segment 368 is configured to be substantially orthogonal to the center 362 of the polishing pad 360. The second concentric groove segment 368 impedes a radial flow of slurry 238 during the CMP process. Further, the second concentric groove segment 368 is located radially outside of the first concentric groove segment 366. In some implementations, the second concentric groove segment 368 may include any of the cross-sectional profiles as described herein. In some implementations, the cross-sectional profile of the second concentric groove segment 368 may be the same as the cross-sectional profiles of other concentric groove segments described herein. Maintaining the same cross-sectional profile for all concentric groove segments may reduce costs associated with manufacturing the polishing pad 360. In some implementations, the cross-sectional profile of the second concentric groove segment 368 may be different than the cross-sectional profile of one or more other concentric groove segments described herein. Forming different cross-sectional profiles for different concentric groove segments on the polishing pad 360 facilitates tailored control of the slurry trajectory.

In some implementations, the polishing pad 360 further includes a third concentric groove segment 370. The third concentric groove segment 370 is configured to be substantially orthogonal to the center 362 of the polishing pad 360. The third concentric groove segment 370 impedes a radial flow of slurry 238 during the CMP process. Further, the third concentric groove segment 370 is located radially outside of the first concentric groove segment 366 and radially outside of the second concentric groove segment 368. In some implementations, the third concentric groove segment 370 may include any of the cross-sectional profiles as described herein. In some implementations, the cross-sectional profile of the third concentric groove segment 370 may be the same as the cross-sectional profiles of other concentric groove segments described herein. Maintaining the same cross-sectional profile for all concentric groove segments may reduce costs associated with manufacturing the polishing pad 360. In some implementations, the cross-sectional profile of the third concentric groove segment 370 may be different than the cross-sectional profile of one or more other concentric groove segments described herein. Forming different cross-sectional profiles for different concentric groove segments on the polishing pad 360 facilitates tailored control of the slurry trajectory.

While the concentric groove segments are illustrated to include three individual concentric groove segments (e.g., the first concentric groove segment 366, the second concentric groove segment 368, and the third concentric groove segment 370), different quantities of greater or fewer concentric groove segments are within the scope of the present disclosure. In some implementations, two or more adjacent concentric groove segments (e.g., the first concentric groove segment 366, the second concentric groove segment 368, or the third concentric groove segment 370) may be spaced on the polishing pad 360 equally relative to two or more other adjacent concentric groove segments. In some implementations, two or more adjacent concentric groove segments (e.g., the first concentric groove segment 366, the second concentric groove segment 368, or the third concentric groove segment 370) may be spaced on the polishing pad 300 differently than two or more other adjacent concentric groove segments.

In some implementations, the polishing pad 360 further includes a polishing pad outer edge 372 (e.g., the polishing pad outer edge 246). The polishing pad outer edge 372 is a terminal edge of the polishing pad 360. During the CMP process, the slurry 238 radially traverses the polishing pad 360 along the slurry trajectory toward the polishing pad outer edge 372.

In some implementations, the polishing pad 360 includes a first plurality of radial groove segments 374A-374C. The first plurality of radial groove segments 374A-374C radially span between and join together with the first concentric groove segment 366 and the second concentric groove segment 368. In some implementations, the first plurality of radial groove segments 374A-374C are configured in a reverse arc with the reverse arc substantially aligned in a direction pointing toward the center 362 of the polishing pad 360. The reverse arc is an arc that points in a direction opposite to the rotation of the polishing pad 360 during the CMP process. In some implementations, the first plurality of radial groove segments 374A-374C may be configured in a reverse arc with the reverse arc substantially aligned in a direction angularly offset from pointing toward the center 362 of the polishing pad 360. In some implementations, the first plurality of radial groove segments 374A-374C may include any of the cross-sectional profiles as described herein. In some implementations, the cross-sectional profile of the first plurality of radial groove segments 374A-374C may be the same as the cross-sectional profiles of other radial groove segments described herein. Maintaining the same cross-sectional profile for all radial groove segments may reduce costs associated with manufacturing the polishing pad 360. In some implementations, the cross-sectional profile of the first plurality of radial groove segments 374A-374C may be different than the cross-sectional profile of one or more other radial groove segments described herein. Forming different cross-sectional profiles for different radial groove segments on the polishing pad 360 facilitates tailored control of the slurry trajectory. While the first plurality of radial groove segments are illustrated to include three individual groove segments, different quantities of greater or fewer radial groove segments are within the scope of the present disclosure.

In some implementations, the polishing pad 360 includes a second plurality of radial groove segments 376A-376C.

The second plurality of radial groove segments 376A-376C radially span between and join together with the second concentric groove segment 368 and the third concentric groove segment 370. In some implementations, the second plurality of radial groove segments 376A-376C are configured in a reverse arc with the reverse arc substantially aligned in a direction pointing toward the center 362 of the polishing pad 360. In some implementations, the second plurality of radial groove segments 376A-376C may be configured in a reverse arc with the reverse arc substantially aligned in a direction angularly offset from pointing toward the center 362 of the polishing pad 360. In some implementations, the second plurality of radial groove segments 376A-376C may include any of the cross-sectional profiles as described herein. In some implementations, the cross-sectional profile of the second plurality of radial groove segments 376A-376C may be the same as the cross-sectional profiles of other radial groove segments described herein. Maintaining the same cross-sectional profile for all radial groove segments may reduce costs associated with manufacturing the polishing pad 360. In some implementations, the cross-sectional profile of the second plurality of radial groove segments 376A-376C may be different than the cross-sectional profile of one or more other radial groove segments described herein. Forming different cross-sectional profiles for different radial groove segments on the polishing pad 360 facilitates tailored control of the slurry trajectory. While the second plurality of radial groove segments are illustrated to include three individual groove segments, different quantities of greater or fewer radial groove segments are within the scope of the present disclosure.

In some implementations, the polishing pad 360 includes a third plurality of radial groove segments 378A-378C. The third plurality of radial groove segments 378A-378C radially span between and join together with the third concentric groove segment 370 and the polishing pad outer edge 372. In some implementations, the third plurality of radial groove segments 378A-378C are configured in a reverse arc with the reverse arc substantially aligned in a direction pointing toward the center 362 of the polishing pad 360. In some implementations, the third plurality of radial groove segments 378A-378C may be configured in a reverse arc with the reverse arc substantially aligned in a direction angularly offset from pointing toward the center 362 of the polishing pad 360. In some implementations, the third plurality of radial groove segments 378A-378C may include any of the cross-sectional profiles as described herein. In some implementations, the cross-sectional profile of the third plurality of radial groove segments 378A-378C may be the same as the cross-sectional profiles of other radial groove segments described herein. Maintaining the same cross-sectional profile for all radial groove segments may reduce costs associated with manufacturing the polishing pad 360. In some implementations, the cross-sectional profile of the third plurality of radial groove segments 378A-378C may be different than the cross-sectional profile of one or more other radial groove segments described herein. Forming different cross-sectional profiles for different radial groove segments on the polishing pad 360 facilitates tailored control of the slurry trajectory. While the third plurality of radial groove segments are illustrated to include three individual groove segments, different quantities of greater or fewer radial groove segments are within the scope of the present disclosure.

In some implementations, the first plurality of radial groove segments 374A-374C are radially offset or staggered (e.g., not radially aligned) from the second plurality of radial groove segments 376A-376C. Additionally, or alternatively, the second plurality of radial groove segments 376A-376C are radially offset or staggered (e.g., not radially aligned) from the third plurality of radial groove segments 378A-378C. Additionally, or alternatively, the first plurality of radial groove segments 374A-374C are radially offset or staggered (e.g., not radially aligned) from the third plurality of radial groove segments 378A-378C. Staggering of the radial groove segments impedes the slurry trajectory by preventing a straight-line path of groove segments from the center of the polishing pad to the polishing pad outer edge 372.

In some implementations, the first concentric groove segment 366, the first plurality of radial groove segments 374A-374C, the second concentric groove segment 368, the second plurality of radial groove segments 376A-376C, the third concentric groove segment 370, and the third plurality of radial groove segments 378A-378C are located along a radius 380 in a groove region 382 of the polishing pad 360.

FIGS. 3A-3C are provided as implementations of radially offsetting or staggering of each of the plurality of radial groove segments to impede the slurry trajectory and provide resistance to the traversal of the slurry radially outward toward the polishing pad outer edge. The offsetting or staggering of each of the radial groove segments removes any straight-line grooves or paths from the center of the polishing pad to the polishing pad outer edge. Removal of straight-line paths results in directing the slurry to traverse a longer, and therefore delayed, path across the groove region of the polishing pad. Further, the concentric groove segments induce lateral dispersion of the slurry rather than radial-only dispersion. In some implementations, the slurry at least partially laterally traverses the polishing pad along one or more concentric groove segments and then at least partially radially traverses the polishing pad along the plurality of radial groove segments between the one or more concentric groove segments until the slurry arrives at the polishing pad outer edge. Accordingly, the combination of radial groove segments radially interrupted or terminated by one or more concentric groove segments impedes the traversal of the slurry from the center of the polishing pad to the polishing pad outer edge.

As indicated above, FIGS. 3A-3C are provided as examples. Other examples may differ from what is described with regard to FIGS. 3A-3C. For example, in some implementations, a polishing pad may include a mixture of radial groove segments from the different pluralities of radial groove segments described in FIGS. 3A-3C. Specifically, a polishing pad may include a first plurality of radial groove segments and one or more second pluralities of radial groove segments, where the first plurality and the one or more second pluralities are different radial groove segments of the radial groove segments of FIGS. 3A-3C.

FIGS. 4A-4D are diagrams of example implementations of polishing pads that include geometric patterns formed by a plurality of groove segments. The geometric patterns formed by subsets of the plurality of groove segments are joined to form a repeating pattern of polygons on portions of the polishing pad.

Figure 4A:
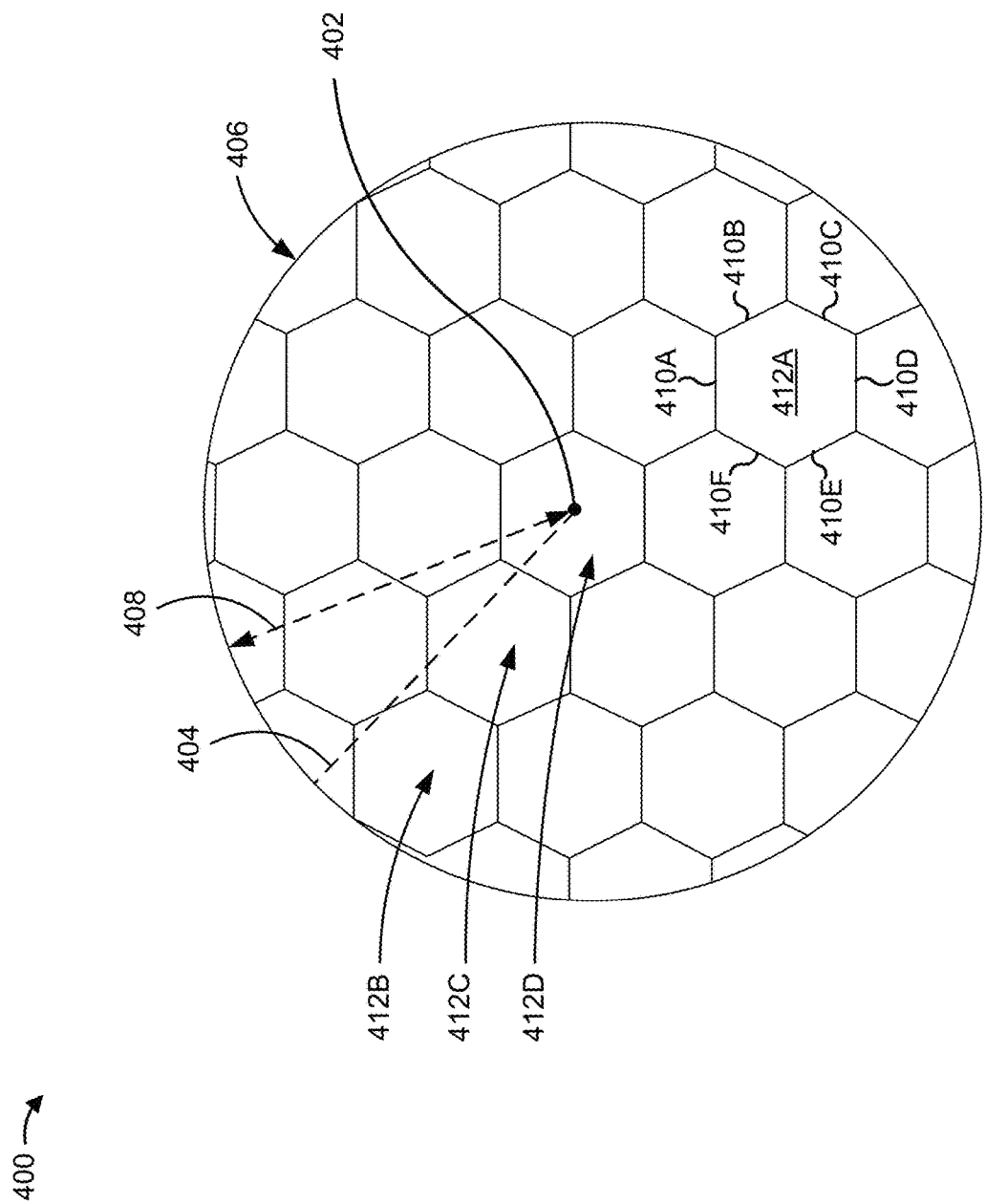
FIGS. 4A-4D are diagrams of example implementations of polishing pads as described herein.

As shown in FIG. 4A, a polishing pad 400 (e.g., the polishing pad 204) includes a plurality of groove segments joined together to form geometric patterns in the form of a repeating pattern of polygons. As shown in FIG. 4A, the polygons are illustrated as hexagons. In some implementations, the polishing pad 400 includes a center 402 (e.g., the center 244). The center 402 identifies a radius 404 from the center 402 to a polishing pad outer edge 406 (e.g., the polishing pad outer edge 246). The center 402 and the radius 404 define a groove region 408 on the polishing pad 400. In some implementations, a plurality of groove segments 410A-410F are joined to form a polygon 412A. Other pluralities of groove segments are joined to form other geometric patterns, such as polygons 412B-412D across the groove region 408 of the polishing pad 400.

In some implementations, the polygons 412A-412D are angularly offset from the center 402. In some implementations, the polygon 412D that encompasses the center 402 includes groove segments joined together that are offset from the center 402. In some implementations during a CMP process, the slurry 238 radially traverses the polishing pad 400 along the slurry trajectory toward the polishing pad outer edge 406. The groove segments angularly offset from the center 402 to impede a radial flow of slurry 238 during the CMP process. In some implementations, the groove segments, such as the groove segments 410A-410F, may include any of the cross-sectional profiles as described herein.

While the plurality of groove segments for forming the polygons 412A-412D are illustrated to include six individual groove segments, different quantities of greater or fewer groove segments are within the scope of the present disclosure.

Figure 4B:
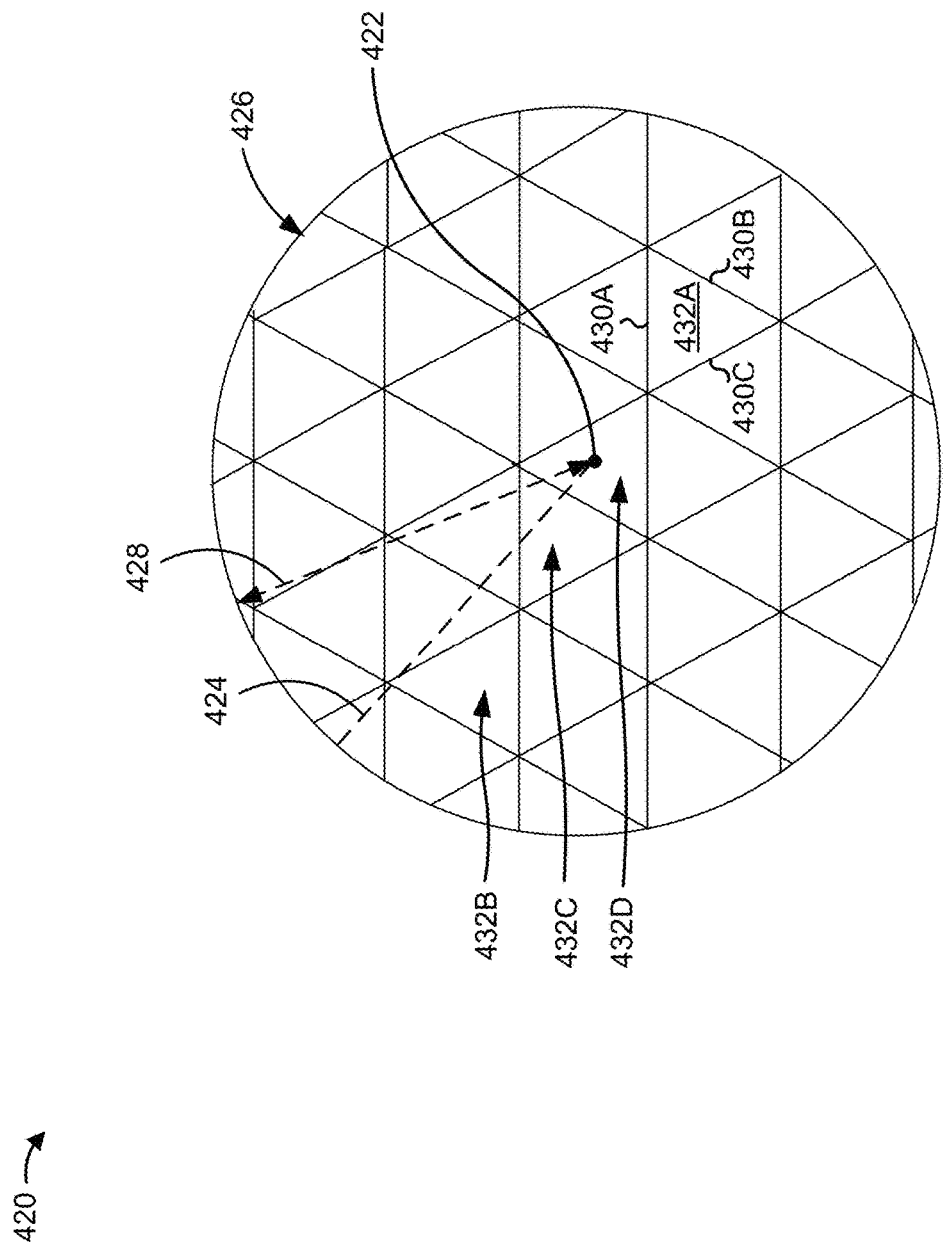

As shown in FIG. 4B, a polishing pad 420 includes a plurality of groove segments joined together to form geometric patterns in the form of a repeating pattern of polygons. As shown in FIG. 4B, the polygons are illustrated as triangles. In some implementations, the polishing pad 420 includes a center 422 (e.g., the center 244). The center 422 identifies a radius 424 from the center 422 to a polishing pad outer edge 426 (e.g., the polishing pad outer edge 246). The center 422 and the radius 424 define a groove region 428 on the polishing pad 420. In some implementations, a plurality of groove segments 430A-430C are joined to form a polygon 432A. Other pluralities of groove segments are joined to form other geometric patterns, such as polygons 432B-432D across the groove region 428 of the polishing pad 420.

In some implementations, the polygons 432A-432D are angularly offset from the center 422. In some implementations, the polygon 432D that encompasses the center 422 includes groove segments joined together that are offset from the center 422. In some implementations during a CMP process, the slurry 238 radially traverses the polishing pad 420 along the slurry trajectory toward the polishing pad outer edge 426. The groove segments angularly offset from the center 422 impede a radial flow of slurry 238 during the CMP process. In some implementations, the groove segments, for example the groove segments 430A-430C, may include any of the cross-sectional profiles as described herein.

While the plurality of groove segments for forming the polygons 432A-432D are illustrated to include three individual groove segments, different quantities of greater or fewer groove segments are within the scope of the present disclosure.

Figure 4C:
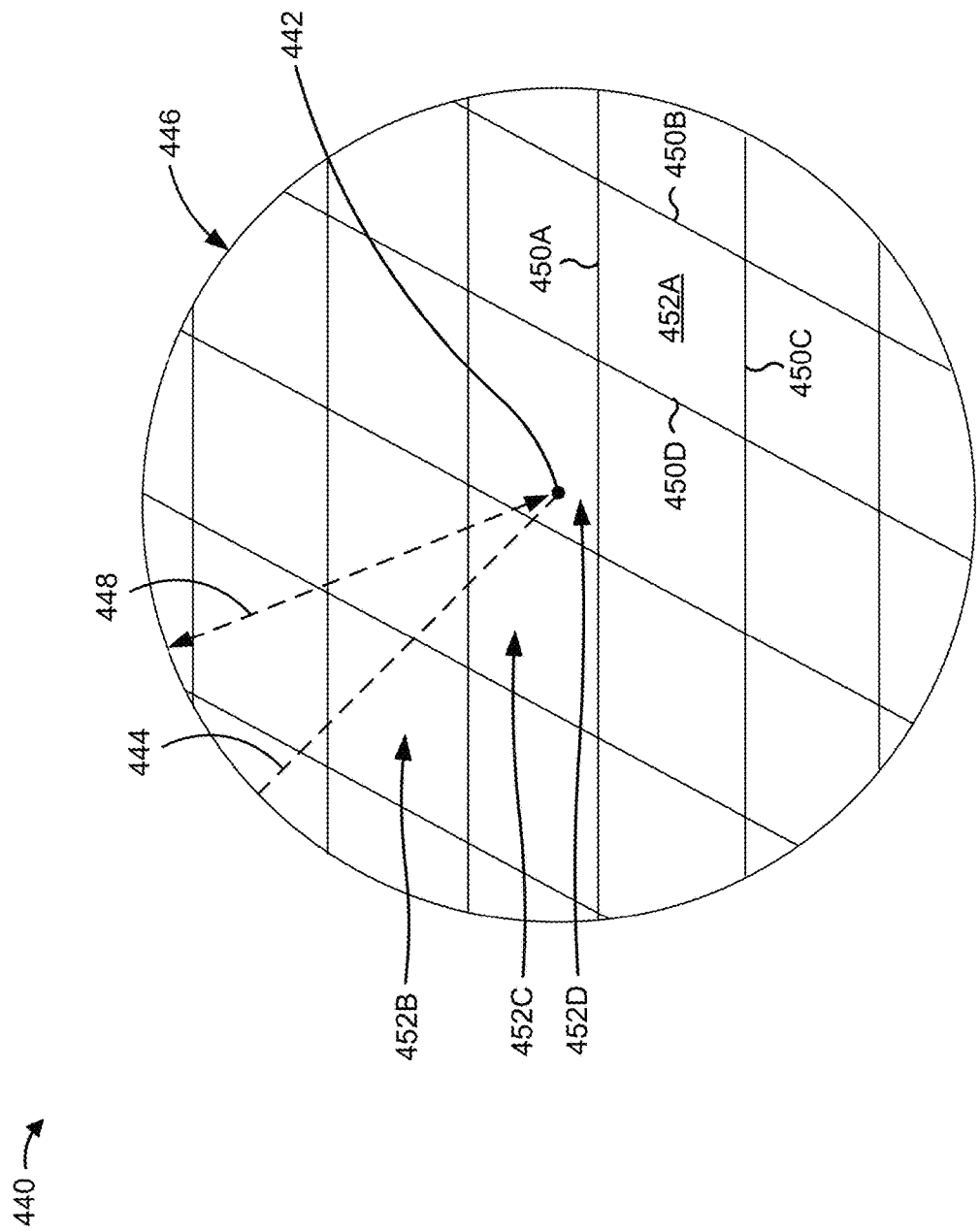

As shown in FIG. 4C, a polishing pad 440 includes a plurality of groove segments joined together to form geometric patterns in the form of a repeating pattern of polygons. As shown in FIG. 4C, the polygons are illustrated as parallelograms, for example, forward parallelograms with respect to a direction of the polishing pad 440 during a CMP process. In some implementations, the polishing pad 440 includes a center 442 (e.g., the center 244). The center 442 identifies a radius 444 from the center 442 to a polishing pad outer edge 446 (e.g., the polishing pad outer edge 246). The center 442 and the radius 444 define a groove region 448 on the polishing pad 440. In some implementations, a plurality of groove segments 450A-450D are joined to form a polygon 452A. Other pluralities of groove segments are joined to form other geometric patterns, such as polygons 452B-452D, across the groove region 448 of the polishing pad 440.

In some implementations, the polygons 452A-452D are angularly offset from the center 442. In some implementations, the polygon 452D that encompasses the center 442 includes groove segments joined together that are offset from the center 442. In some implementations during the CMP process, the slurry 238 radially traverses the polishing pad 440 along the slurry trajectory toward the polishing pad outer edge 446. The groove segments angularly offset from the center 442 impede a radial flow of slurry 238 during the CMP process. In some implementations, the groove segments, such as the plurality of groove segments 450A-450D, may include any of the cross-sectional profiles as described herein.

While the plurality of groove segments for forming the polygons 452A-452D are illustrated to include four individual groove segments, different quantities of greater or fewer groove segments are within the scope of the present disclosure.

Figure 4D:
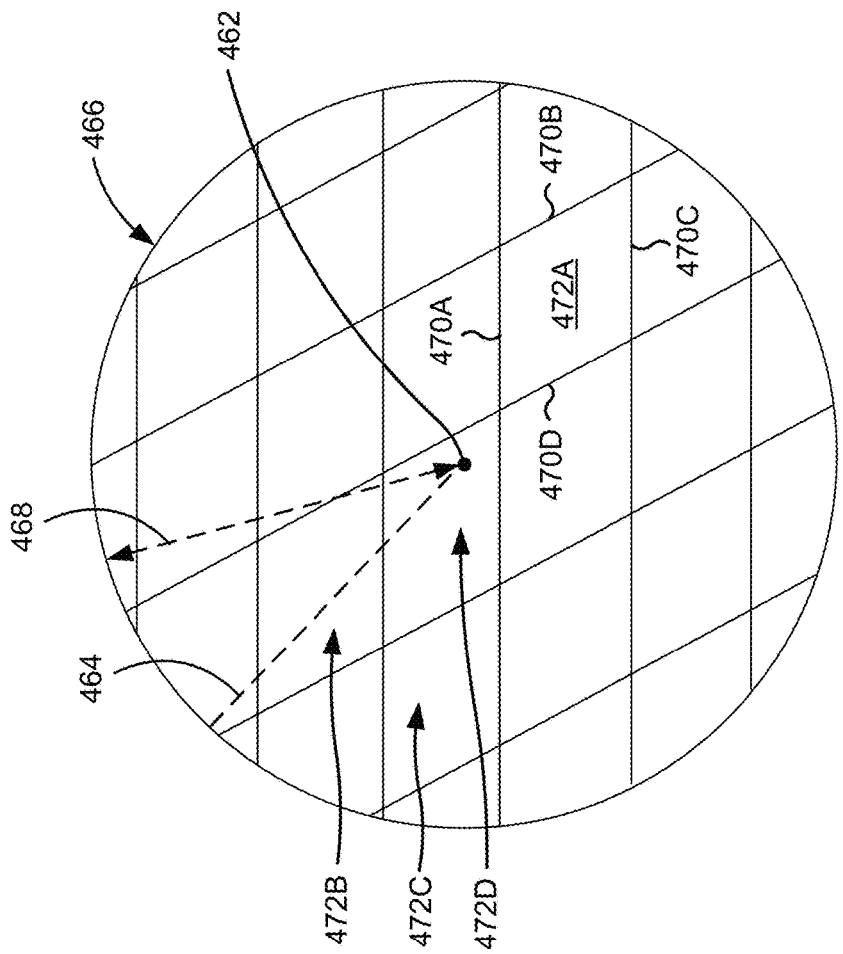

As shown in FIG. 4D, a polishing pad 460 includes a plurality of groove segments joined together to form geometric patterns in the form of a repeating pattern of polygons. As shown in FIG. 4D, the polygons are illustrated as parallelograms, for example, reverse parallelograms with respect to a direction of the polishing pad 460 during a CMP process. In some implementations, the polishing pad 460 includes a center 462 (e.g., the center 244). The center 462 identifies a radius 464 from the center 462 to a polishing pad outer edge 466 (e.g., the polishing pad outer edge 246). The center 462 and the radius 464 define a groove region 468 on the polishing pad 460. In some implementations, a plurality of groove segments 470A-470D are joined to form a polygon 472A. Other pluralities of groove segments are joined to form other geometric patterns, such as polygons 472B-472D, across the groove region 468 of the polishing pad 460.

In some implementations, the polygons 472A-472D are angularly offset from the center 462. In some implementations, the polygon 472D that encompasses the center 462 includes groove segments joined together that are offset from the center 462. In some implementations during the CMP process, the slurry 238 radially traverses the polishing pad 460 along the slurry trajectory toward the polishing pad outer edge 466. The groove segments angularly offset from the center 462 impede a radial flow of slurry 238 during the CMP process. In some implementations, the groove segments, such as the groove segments 470A-470D, may include any of the cross-sectional profiles as described herein.

While the plurality of groove segments for forming the polygons 472A-472D are illustrated to include four groove segments joined together, different quantities of greater or fewer groove segments joined together are within the scope of the present disclosure.

FIGS. 4A-4D are provided as examples of joining a plurality of groove segments to form a repeating pattern of polygons in portions of the polishing pad. The repeating patterns of polygons impede the slurry trajectory and provide resistance to the traversal of the slurry radially outward toward the polishing pad outer edge. The forming of a repeating pattern of polygons on the polishing pad, where each of the polygons is offset from the center of the polishing pad, removes any straight-line grooves or paths from the center of the polishing pad to the polishing pad outer edge. Removal of straight-line paths results in directing the slurry to traverse a longer and, therefore, delayed path across the groove region of the polishing pad. Further, the pattern of polygons induce lateral dispersion of the slurry rather than radial-only dispersion. In some implementations, the slurry at least partially laterally traverses the polishing pad along one or more geometric patterns formed by the plurality of groove segments until the slurry arrives at the polishing pad outer edge. Accordingly, the repeating pattern of polygons on the polishing pad impedes the traversal of the slurry from the center of the polishing pad to the polishing pad outer edge.

As indicated above, FIGS. 4A-4D are provided as examples. Other examples may differ from what is described with regard to FIGS. 4A-4D. For example, a polishing pad may be configured to include a combination of different geometric patterns of groove segments (e.g., a mixture of triangles and parallelograms, or a mixture of hexagons and parallelograms, among other examples). Additionally, or alternatively, the polishing pad may be configured to include a first type of geometric pattern of groove segments in a first area (e.g., about a first radius of the polishing pad) of the polishing pad, and a second (different) type of geometric pattern of groove segments in a second area (e.g., about a different second radius of the polishing pad) of the polishing pad. Additionally, or alternatively, the polishing pad may be configured to include a combination of geometric patterns of groove segments from any or all of the geometric patterns described with respect to FIGS. 3A-3C and FIGS. 4A-4D. For example, the polishing pad may include a first set of groove segments (the concentric groove segments and the radial groove segments from FIGS. 3A, 3B, and/or 3C) in a first area of the polishing pad and a second set of groove segments (the geometric patterns formed by the groove segments from FIGS. 4A, 4B, 4C, and/or 4D) in a second area of the polishing pad.

Figure 5A:
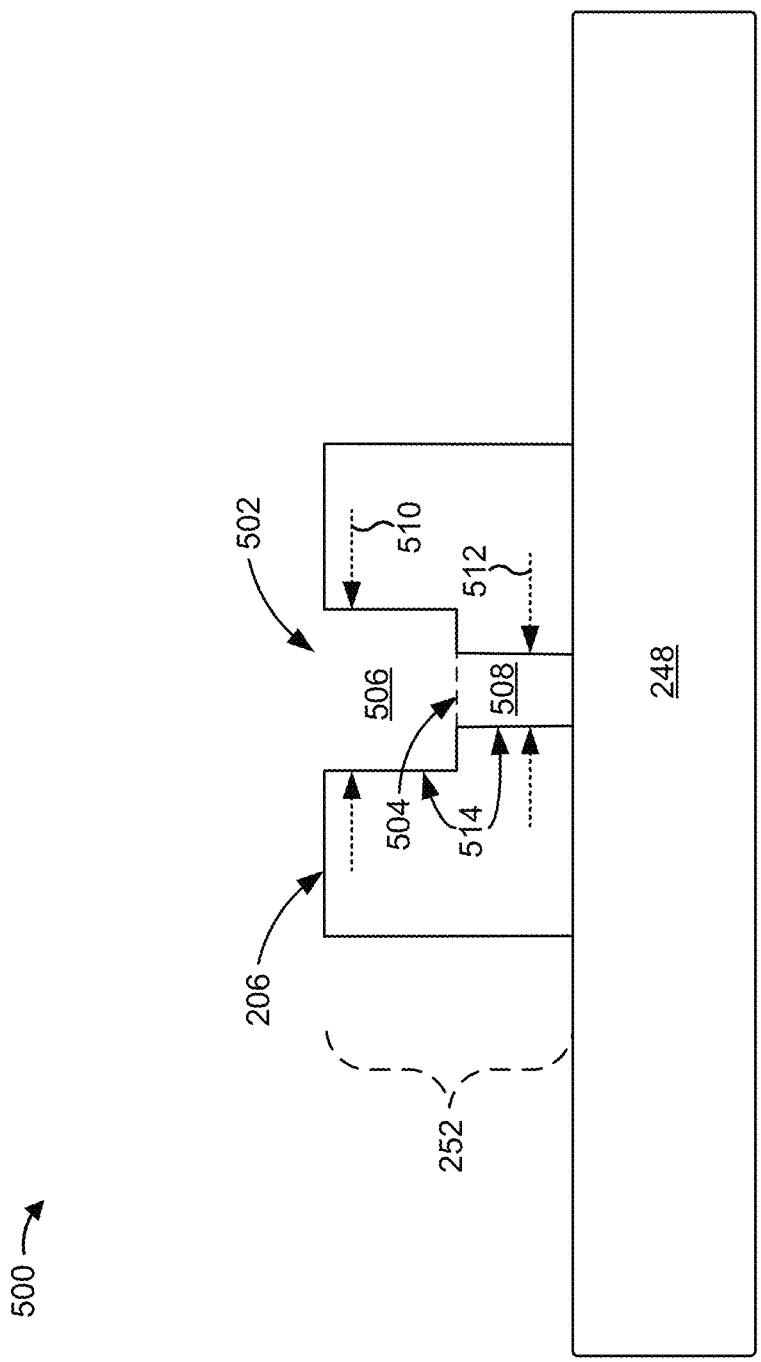
FIGS. 5A and 5B are diagrams of cross-sectional views of example profiles of groove segments in the example polishing pads as described herein.
Figure 5B:
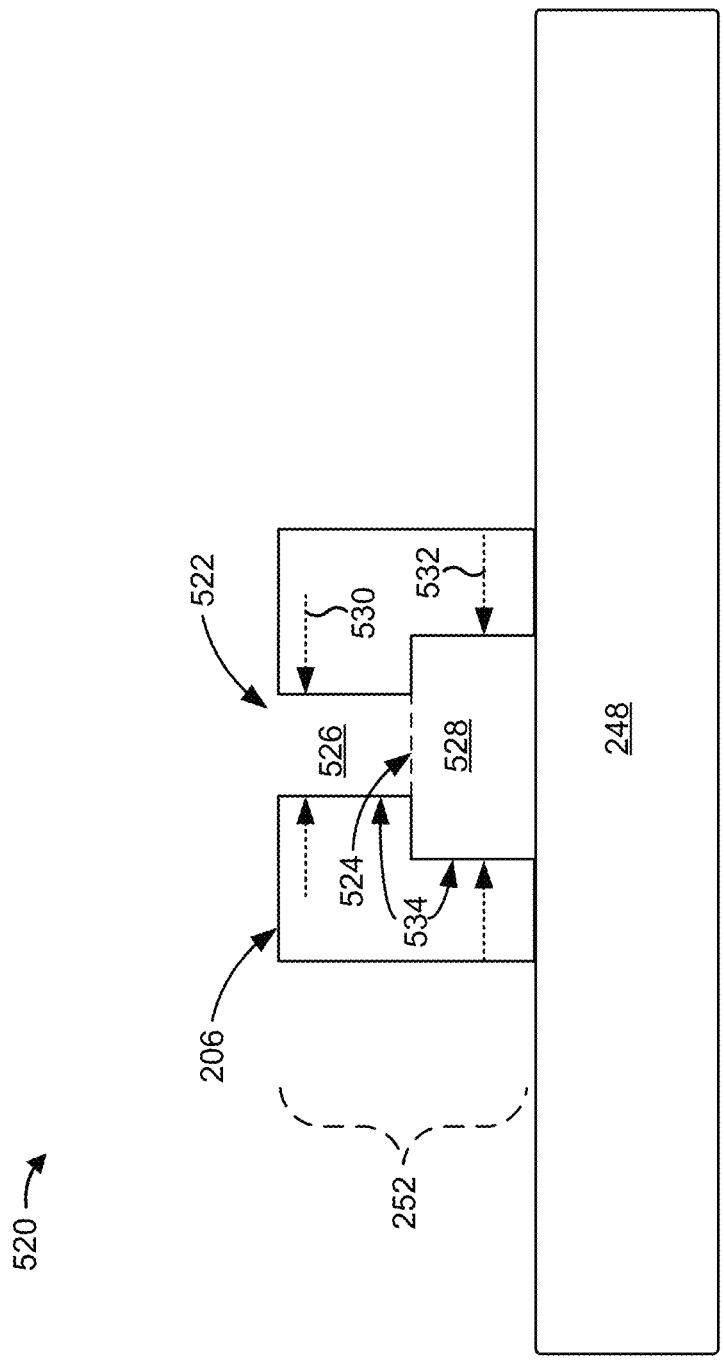

FIGS. 5A and 5B are diagrams of cross-sectional views of example profiles of groove segments in the example polishing pads as described herein. The various profiles of the groove segments provide control of the slurry trajectory across a polishing pad, by increasing retention of the slurry within the groove segments and the geometric patterns formed by the plurality of groove segments.

FIG. 5A is a cross-sectional diagram of a portion of a polishing pad 500 (e.g., the polishing pad 204). In some implementations, the polishing pad 500 includes the pad base 248 and the groove layer 252, as described herein. The groove layer 252 further includes a polishing surface 206, as described herein. The groove layer 252 includes groove segments (e.g., the concentric groove segments and/or the radial groove segments of FIGS. 3A-3C and/or the groove segments of FIGS. 4A-4D) formed therein. A cross-sectional profile 502 illustrates the cross-sectional profile of any of the concentric groove segments and/or the radial groove segments of FIGS. 3A-3C, and/or the groove segments of FIGS. 4A-4C, and of any of the implementations described herein.

In some implementations, the cross-sectional profile 502 includes a step 504 that separates an upper groove segment portion 506 and a lower groove segment portion 508. The upper groove segment portion 506 includes a first groove segment width 510 above the step 504. The lower groove segment portion 508 includes a second groove segment width 512 below the step 504. The cross-sectional profile 502 further includes groove segment sidewalls 514 along the depth of the cross-sectional profile 502. As shown in FIG. 5A, the first groove segment width 510 is larger in width than the second groove segment width 512. Accordingly, the cross-sectional profile 502 may be termed as having a convex bottom. The groove segments (e.g., of FIGS. 3A, 3B, 3C, 4A, 4B, 4C, and/or 4D) formed to include the convex bottom illustrated in the cross-sectional profile 502 provides for improved uniform slurry trajectory across the polishing pad (e.g., the polishing pad 204) during a CMP process.

FIG. 5B is a cross-sectional diagram of a portion of a polishing pad 520 (e.g., the polishing pad 204). In some implementations, the polishing pad 520 includes the pad base 248 and the groove layer 252, as described herein. The groove layer 252 further includes a polishing surface 206, as described herein. The groove layer 252 includes groove segments (e.g., the concentric groove segments and/or the radial groove segments of FIGS. 3A-3C, and/or the groove segments of FIGS. 4A-4D) formed therein. A cross-sectional profile 522 illustrates the cross-sectional profile of any of the concentric groove segments and/or the radial groove segments of FIGS. 3A-3C, and the groove segments of FIGS. 4A-4C, and of any of the implementations described herein.

In some implementations, the cross-sectional profile 522 includes a step 524 that separates an upper groove segment portion 526 and a lower groove segment portion 528. The upper groove segment portion 526 includes a first groove segment width 530 above the step 524. The lower groove segment portion 528 includes a second groove segment width 532 below the step 524. The cross-sectional profile 522 further includes groove segment sidewalls 534 along the depth of the cross-sectional profile 522. As shown in FIG. 5B, the first groove segment width 530 is smaller in width than the second groove segment width 532. Accordingly, the cross-sectional profile 522 may be termed as having a concave bottom. The groove segments (e.g., of FIGS. 3A, 3B, 3C, 4A, 4B, 4C, and/or 4D) formed to include the concave bottom illustrated in the cross-sectional profile 522 provides for improved uniform slurry trajectory across the polishing pad (e.g., the polishing pad 204) during a CMP process.

The first groove segment width 510, the second groove segment width 512, the first groove segment width 530, and the second groove segment width 532 may be included in a range of approximately 0.1 millimeter (mm) to approximately 20 mm. A depth of each of the upper groove segment portion 506, the lower groove segment portion 508, the upper groove segment portion 526, and the lower groove segment portion 528 may be included in a range of approximately 0.1 mm to approximately 10 mm.

As indicated above, FIGS. 5A and 5B are provided as examples. Other examples may differ from what is described with regard to FIGS. 5A and 5B. For example, the cross-sectional profiles of the groove segments (e.g., the groove segments of FIGS. 3A, 3B, 3C, 4A, 4B, 4C, and/or 4D) for one or more of the groove segments on a polishing pad may be different from the cross-sectional profile of another one or more of the groove segments on the polishing pad. In another example, the cross-sectional profiles of the all of the groove segments (e.g., the groove segments of FIGS. 3A, 3B, 3C, 4A, 4B, 4C, and/or 4D) on a polishing pad may be the same.

Figure 6:
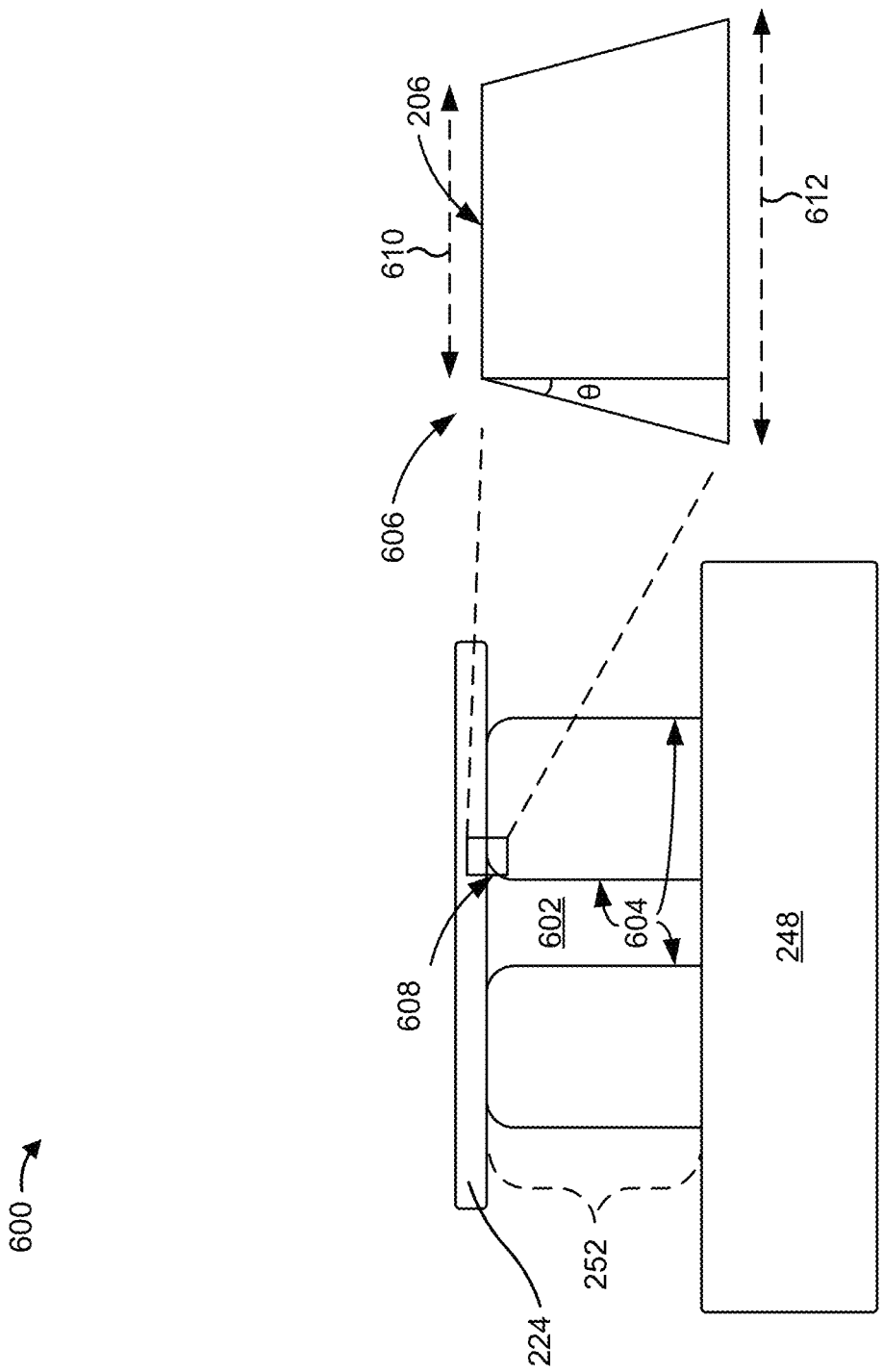
FIG. 6 is a diagram of a cross-sectional view of example profiles of groove segments in the example polishing pads as described herein.

FIG. 6 is a diagram of a cross-sectional view of an example profile of the groove segments in the example polishing pad as described herein. A cross-sectional profile of a polishing pad 600 (e.g., the polishing pad 204) includes the pad base 248 and the groove layer 252, as described herein. The groove layer 252 includes a polishing surface 206 that interfaces with the semiconductor wafer 224, as described herein. The groove layer 252 further includes a groove segment 602 (e.g., one of the groove segments of FIGS. 3A, 3B, 3C, 4A, 4B, 4C, and/or 4D) formed therein. The groove segment 602 may be one of the radial groove segments or the concentric groove segments of FIGS. 3A-3C, or one of the groove segments of FIGS. 4A-4D, or any combination thereof, of any of the implementations described herein.

In some implementations, the groove segment 602 includes groove segment sidewalls 604 along the depth of the groove segment 602. During a CMP process, the semiconductor wafer 224 is polished and planarized using the polishing pad 600. The semiconductor wafer 224 is subjected to abrasion by the polishing surface 206 of the groove layer 252. The corners of the groove segment sidewalls 604 may subject the semiconductor wafer 224 to excessive or unpredictable abrasion.

In some implementations, one or more groove segment sidewall corners 606 may be chamfered, and/or beveled to improve characterization of the CMP process. In some implementations, the groove segment sidewall corner 606 includes an angled top edge 608 between the groove segment sidewalls 604 and the top or polishing surface 206 of the polishing pad 600. In some implementations, the groove segment sidewall corner 606 may be tapered according to an angle Θ, where a groove segment sidewall width 610 at the polishing surface 206 is smaller than a groove segment sidewall width 612 of another portion of the groove segment 602. The angle Θ may be included in a range of approximately 0 degrees to approximately 5 degrees to reduce the occurrence of scratching defects on the semiconductor wafer 224 while providing sufficient contact area with the polishing pad 600 (e.g., the angle reduces the contact area by approximately 2.2%, which is nominal in the CMP process). As an example, the groove segment sidewall width 612 may be approximately 1022 micrometers (µm) and the groove segment sidewall width 610 may be approximately 1000 µm with an angle Θ of approximately 5 degrees. The groove segment sidewall width 610 may be included in a range of approximately 1000 µm to approximately 10,000 µm. The angle Θ may be determined based on a usable life of the polishing pad 600, where the usable life of the polishing pad 600 causes a reduction in a height of groove segment sidewalls 604, for example, of about 5 (mm).

As indicated above, FIG. 6 is provided as an example. Other examples may differ from what is described with regard to FIG. 6. For example, the chamfered or beveled groove sidewall corners (e.g., the groove segment sidewall corner 606) may include a curved chamfer or bevel profile.

FIGS. 7A-7D are diagrams of an example of a process using the CMP system 100 of FIG. 1 and/or the example of the CMP tool 200 of FIGS. 2A and 2B for performing a CMP process. While a specific process is illustrated, the system, tools, and processes described are applicable to various CMP processes.

Figure 7A:
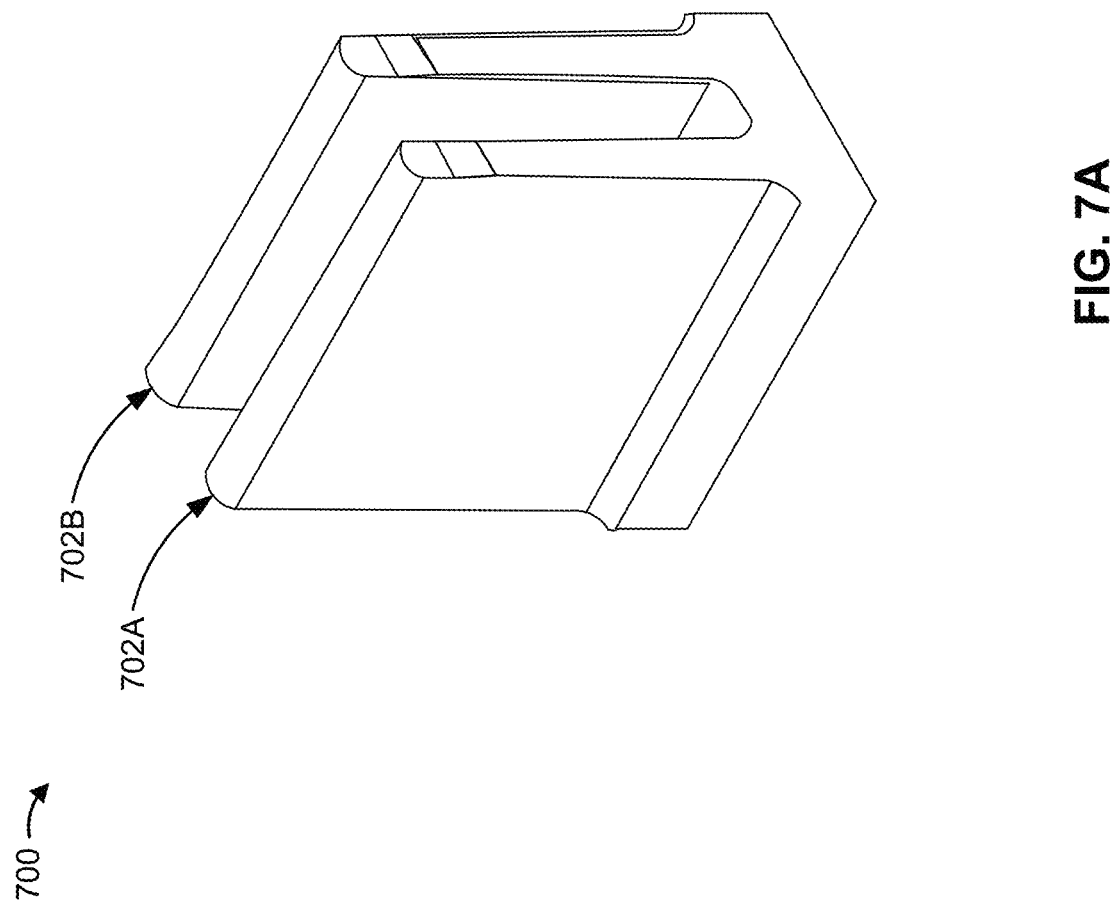
FIGS. 7A-7D are diagrams of an example of a process using the example tool of FIG. 1 for performing a CMP process.

FIG. 7A is a diagram of a perspective view of an example of a circuit structure 700 formed as part of the semiconductor wafer 224. The circuit structure 700 may include examples of fin structures 702A and 702B. The fin structures 702A and 702B are one example of structures that may be formed on the semiconductor wafer 224.

Figure 7B:
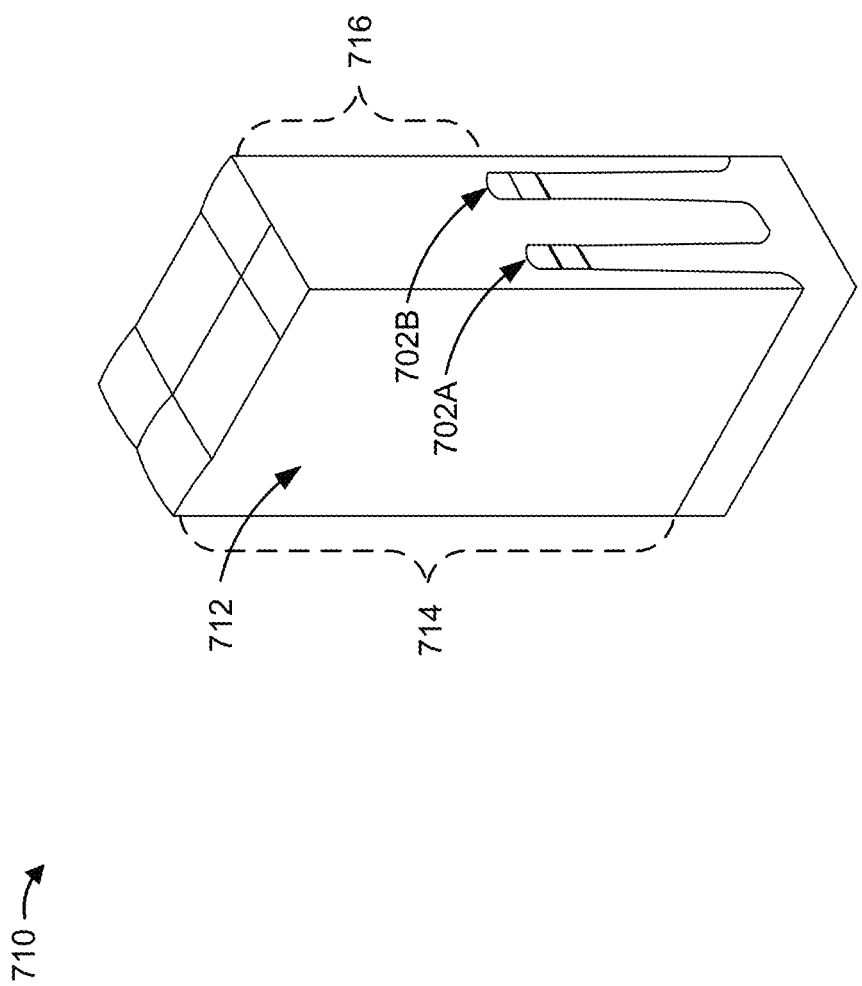

FIG. 7B is a diagram of a perspective view of an example of a circuit structure 710 following an example deposition process on the circuit structure 700 of FIG. 7A. The example deposition process may include a flowable chemical vapor deposition (FCVD) process for depositing an electrically insulating layer, such as an oxide layer 712 (e.g., a shallow trench isolation structure), between and on, for example, the fin structures 702A and 702B. In some implementations, the deposited oxide layer 712 is deposited with a thickness 714, which includes an excess thickness 716. The excess thickness 716 may be removed in order to form further contacts with the fin structures 702A and 702B.

Figure 7C:
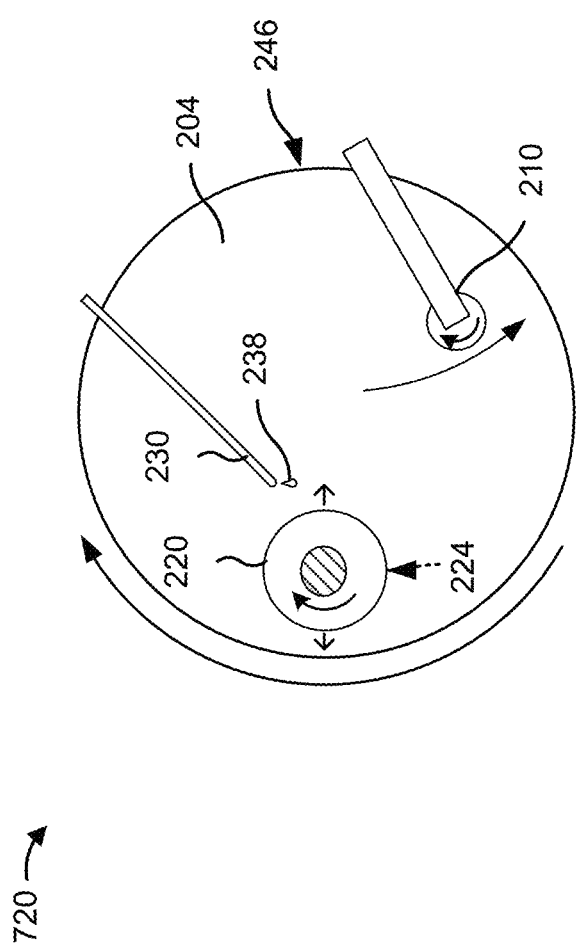

FIG. 7C is a diagram of an example of a CMP process 720 performed on the circuit structure 710 of FIG. 7B. The CMP process 720 includes utilizing the CMP tool 200 as described with respect to FIGS. 2A and 2B. In some implementations, the wafer carrier 220 mounts and secures the semiconductor wafer 224. The slurry system 230 applies the slurry 238 to the polishing pad 204. The conditioner 210 spreads the slurry 238 across the polishing pad 204 while the polishing pad 204 is in motion. During the CMP process 720, the polishing pad 204 and the wafer carrier 220 rotate and/or oscillate to perform a planarization of the semiconductor wafer 224. The CMP process 702 removes an amount, for example the excess thickness 716, of the oxide layer 712 from the semiconductor wafer 224.

In some implementations, the CMP process 720 includes dispensing the slurry 238 onto the polishing pad 204, and rotating the polishing pad 204, where rotation of the polishing pad 204 results in a slurry trajectory of the slurry 238 radially outward toward the polishing pad outer edge 246 of the polishing pad 204. In these implementations, the polishing pad 204 further includes a first concentric groove segment (e.g., the first concentric groove segment 306, 336, or 366). The polishing pad 204 further includes a second concentric groove segment (e.g., the second concentric groove segment 308, 338, or 368) located between the first concentric groove segment and the polishing pad outer edge 246. The polishing pad 204 further includes a third concentric groove segment (e.g., the third concentric groove segment 310, 340, or 370) located between the second concentric groove segment and the polishing pad outer edge 246. The polishing pad 204 further includes a first plurality of radial groove segments (e.g., the first plurality of radial groove segments 314A-314C, 344A-344C, or 374A-374C) extending between the first concentric groove segment and the second concentric groove segment. The polishing pad 204 further includes a second plurality of radial groove segments (e.g., the second plurality of radial groove segments 316A-316C, 346A-346C, or 376A-376C) extending between the second concentric groove segment and the third concentric groove segment, and where the first plurality of radial groove segments are radially staggered from the second plurality of radial groove segments.

In some implementations, the CMP process 720 includes dispensing the slurry 238 onto the polishing pad 204, and rotating the polishing pad 204, where rotation of the polishing pad results in a slurry trajectory of the slurry 238 radially outward toward the polishing pad outer edge 246 of the polishing pad 204. In these implementations, the polishing pad 204 includes a plurality of groove segments (e.g., the groove segments 410A-410F, 430A-430C, 450A-450D, and/or 470A-470D), where subsets of the plurality of groove segments join to form a repeating pattern of polygons (e.g., the polygons 412A-412D, 432A-432D, 452A-452D, and/or 472A-472D) in portions of the polishing pad 204 between the plurality of groove segments, and where the plurality of groove segments are offset from a center (e.g., the center 244, 402, 422, 442, or 462) of the polishing pad 204.

In some implementations, the groove segments (e.g., the groove segments of FIGS. 3A, 3B, 3C, 4A, 4B, 4C, and/or 4D) may include the cross-sectional profiles of the groove segments as shown in FIGS. 5A, 5B, and/or FIG. 6.

Figure 7D:
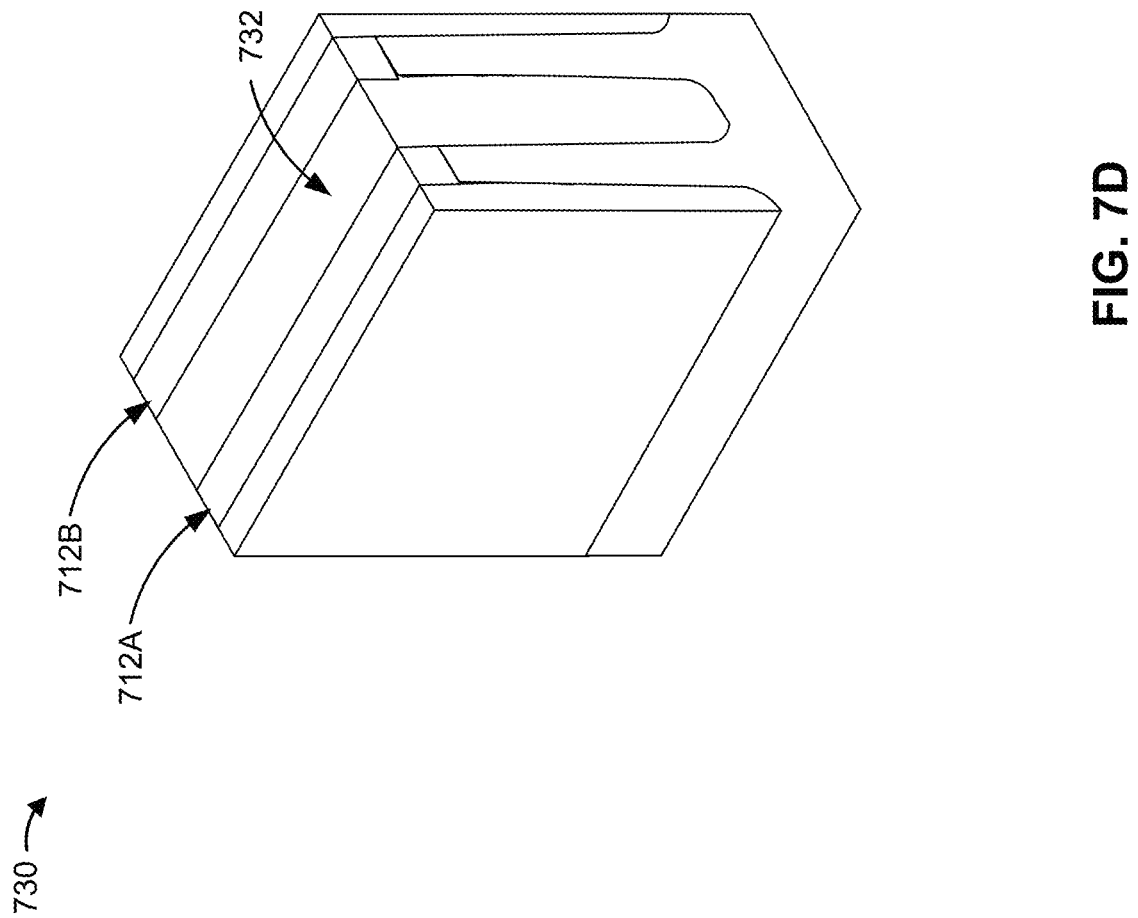

FIG. 7D is a diagram of an example of a circuit structure 730 following completion of the CMP process 720 using the CMP tool 200 described herein. In some implementations, the circuit structure 730 includes a planarized surface 732 enabling subsequent processes to be performed on the resultant fin structures 712A and 712B.

As indicated above, FIGS. 7A-7D are provided as examples. Other examples may differ from what is described with regard to FIGS. 7A-7D. For example, the CMP process may be performed on structures other than fin structures (e.g., the fin structures 702A and 702B). Additionally, or alternatively, the CMP process may remove material other than an oxide layer (e.g., the oxide layer 712).

Figure 8:
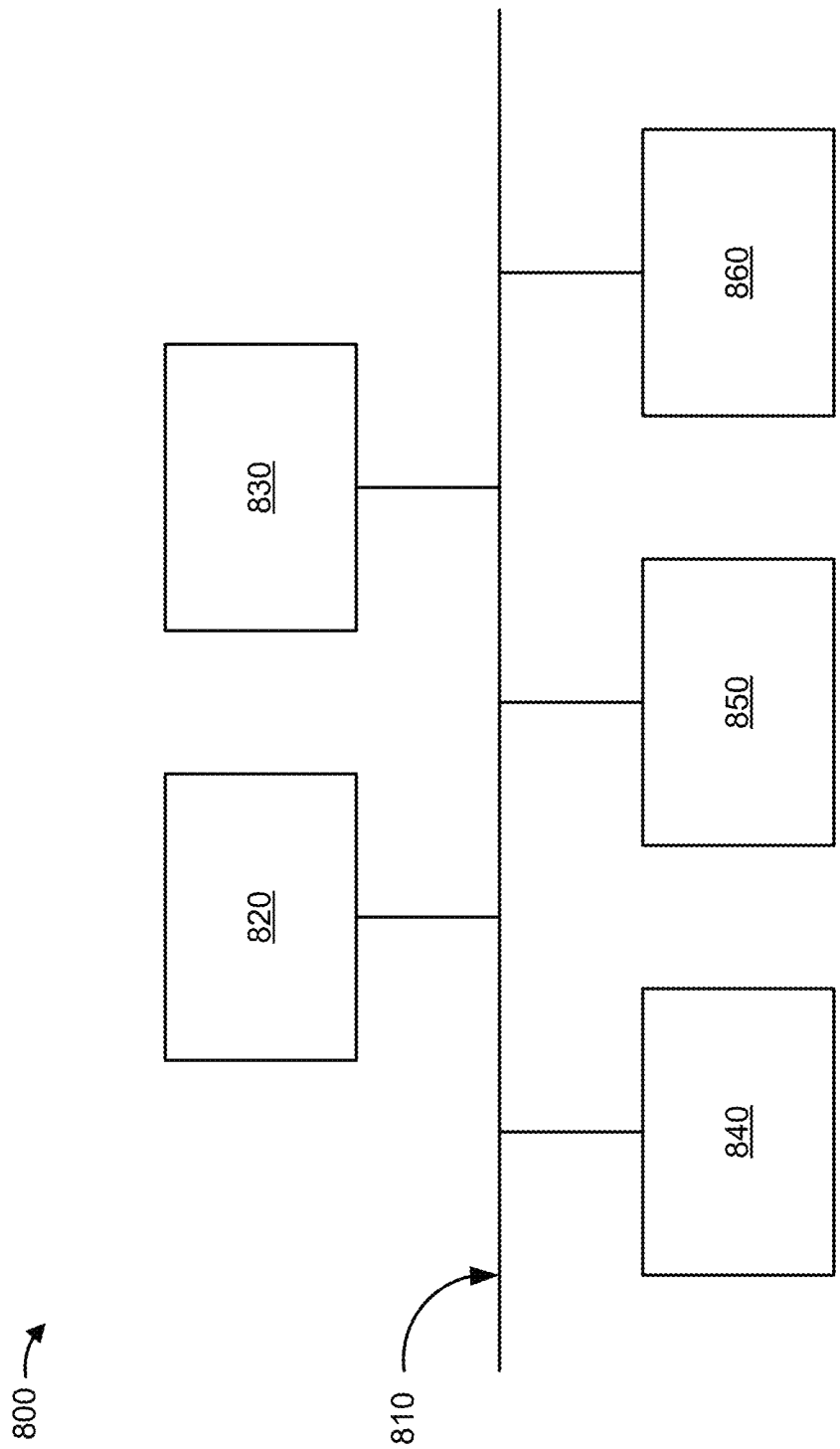
FIG. 8 is a diagram of example components of one or more devices of FIG. 1 described herein.

FIG. 8 is a diagram of example components of a device 800, which may correspond to CMP system 100 and CMP tool 200. In some implementations, the CMP system 100 and the CMP tool 200 may include one or more devices 800 and/or one or more components of device 800. As shown in FIG. 8, device 800 may include a bus 810, a processor 820, a memory 830, an input component 840, an output component 850, and a communication component 860.

Bus 810 includes one or more components that enable wired and/or wireless communication among the components of device 800. Bus 810 may couple together two or more components of FIG. 8, such as via operative coupling, communicative coupling, electronic coupling, and/or electric coupling. Processor 820 includes a central processing unit, a graphics processing unit, a microprocessor, a controller, a microcontroller, a digital signal processor, a field-programmable gate array, an application-specific integrated circuit, and/or another type of processing component. Processor 820 is implemented in hardware, firmware, or a combination of hardware and software. In some implementations, processor 820 includes one or more processors capable of being programmed to perform one or more operations or processes described elsewhere herein.

Memory 830 includes volatile and/or nonvolatile memory. For example, memory 830 may include random access memory (RAM), read only memory (ROM), a hard disk drive, and/or another type of memory (e.g., a flash memory, a magnetic memory, and/or an optical memory). Memory 830 may include internal memory (e.g., RAM, ROM, or a hard disk drive) and/or removable memory (e.g., removable via a universal serial bus connection). Memory 830 may be a non-transitory computer-readable medium. Memory 830 stores information, instructions, and/or software (e.g., one or more software applications) related to the operation of device 800. In some implementations, memory 830 includes one or more memories that are coupled to one or more processors (e.g., processor 820), such as via bus 810.

Input component 840 enables device 800 to receive input, such as user input and/or sensed input. For example, input component 840 may include a touch screen, a keyboard, a keypad, a mouse, a button, a microphone, a switch, a sensor, a global positioning system sensor, an accelerometer, a gyroscope, and/or an actuator. Output component 850 enables device 800 to provide output, such as via a display, a speaker, and/or a light-emitting diode. Communication component 860 enables device 800 to communicate with other devices via a wired connection and/or a wireless connection. For example, communication component 860 may include a receiver, a transmitter, a transceiver, a modem, a network interface card, and/or an antenna.

Device 800 may perform one or more operations or processes described herein. For example, a non-transitory computer-readable medium (e.g., memory 830) may store a set of instructions (e.g., one or more instructions or code) for execution by processor 820. Processor 820 may execute the set of instructions to perform one or more operations or processes described herein. In some implementations, execution of the set of instructions, by one or more processors 820, causes the one or more processors 820 and/or the device 800 to perform one or more operations or processes described herein. In some implementations, hardwired circuitry may be used instead of or in combination with the instructions to perform one or more operations or processes described herein. Additionally, or alternatively, processor 820 may be configured to perform one or more operations or processes described herein. Thus, implementations described herein are not limited to any specific combination of hardware circuitry and software.

The number and arrangement of components shown in FIG. 8 are provided as an example. Device 800 may include additional components, fewer components, different components, or differently arranged components than those shown in FIG. 8. Additionally, or alternatively, a set of components (e.g., one or more components) of device 800 may perform one or more functions described as being performed by another set of components of device 800.

Figure 9:
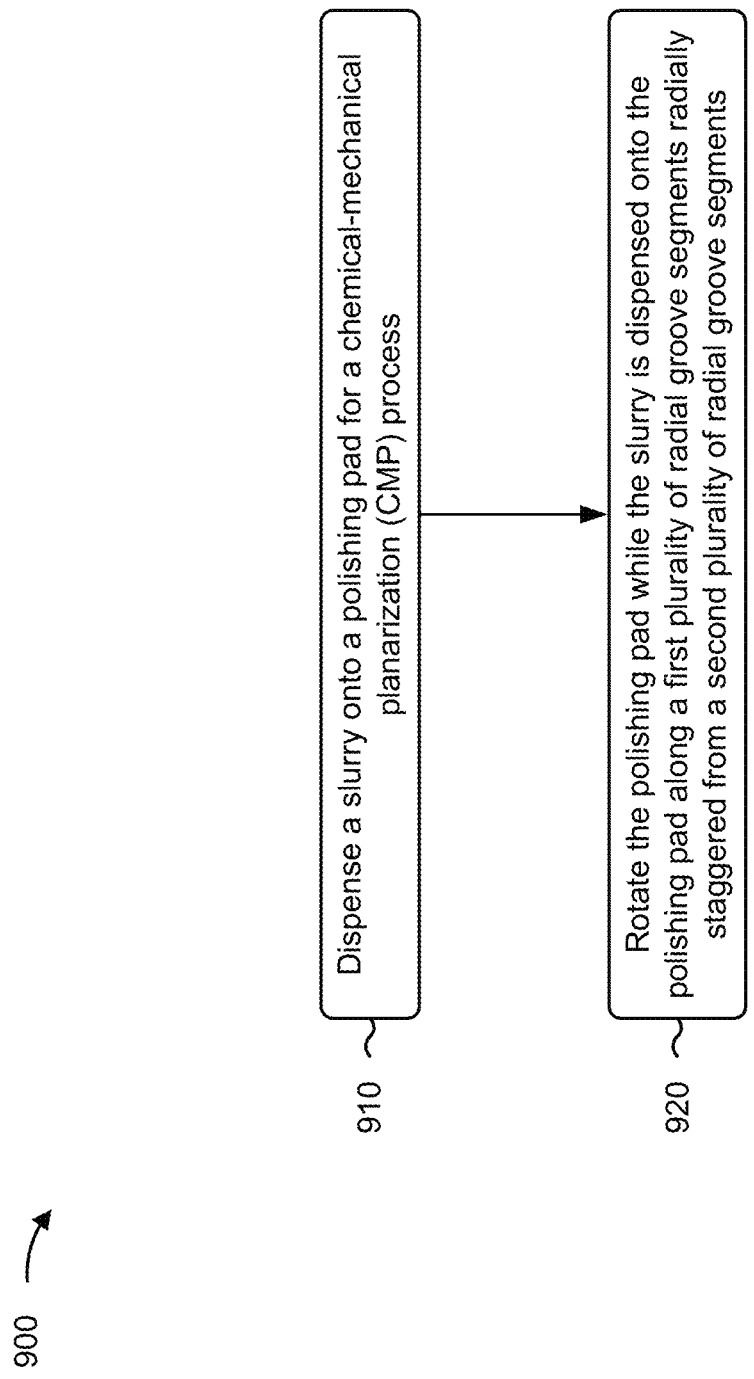
FIG. 9 is a flowchart of an example of a process relating to a CMP process described herein.

FIG. 9 is a flowchart of an example of a process 900 relating to a CMP process described herein. In some implementations, one or more process blocks of FIG. 9 may be performed by a polishing system or polishing tool (e.g., CMP system 100 or CMP tool 200). In some implementations, one or more process blocks of FIG. 9 may be performed by another device or a group of devices separate from or including the CMP system or the CMP tool. Additionally, or alternatively, one or more process blocks of FIG. 9 may be performed by one or more components of device 800, such as processor 820, memory 830, input component 840, output component 850, and/or communication component 860.

As shown in FIG. 9, process 900 may include dispensing a slurry onto a polishing pad for a chemical-mechanical planarization (CMP) process (block 910). For example, the CMP system 100 or the CMP tool 200 may dispense a slurry onto a polishing pad 204 for a chemical-mechanical planarization (CMP) process, as described above.

As further shown in FIG. 9, process 900 may include rotating the polishing pad while the slurry is dispensed onto the polishing pad along a first plurality of radial groove segments radially staggered from a second plurality of radial groove segments (block 920). For example, the CMP system 100 or the CMP tool 200 may rotate the polishing pad 204 while the slurry 238 is dispensed onto the polishing pad 204, as described above. Rotation of the polishing pad 204 results in a traversal of the slurry radially outward toward a polishing pad outer edge 246 of the polishing pad 204. The polishing pad 204 further includes thereon a first concentric groove segment (e.g., the first concentric groove segment 306, 336, or 366). The polishing pad 204 further includes thereon a second concentric groove segment (e.g., the second concentric groove segment 308, 338, or 368) located between the first concentric groove segment and the polishing pad outer edge 246. The polishing pad 204 further includes thereon a third concentric groove segment (e.g., the third concentric groove segment 310, 340, or 370) located between the second concentric groove segment and the polishing pad outer edge 246. The polishing pad 204 includes a first plurality of radial groove segments (e.g., the first plurality of radial groove segments 314A-314C, 344A-344C, or 374A-374C) extending between the first concentric groove segment and the second concentric groove segment.

The polishing pad 204 further includes a second plurality of radial groove segments (e.g., the second plurality of radial groove segments 316A-316C, 346A-346C, or 376A-376C) extending between the second concentric groove segment and the third concentric groove segment. The first plurality of radial groove segments are radially staggered from the second plurality of radial groove segments.

Process 900 may include additional implementations, such as any single implementation or any combination of implementations described below and/or in connection with one or more other processes described elsewhere herein.

In a first implementation, the first plurality of radial groove segments (e.g., the first plurality of radial groove segments 314A-314C, 344A-344C, or 374A-374C) being radially staggered from the second plurality of radially groove segments provides resistance to the traversal of the slurry 238 radially outward toward the polishing pad outer edge 246.

In a second implementation, alone or in combination with the first implementation, the polishing pad further includes a third plurality of radial groove segments (e.g., the third plurality of radial groove segments 318A-318C, 348A-348C, or 378A-378C) extending between the third concentric groove segment and the polishing pad outer edge 246.

In a third implementation, alone or in combination with one or more of the first and second implementations, at least one of the first plurality of radial groove segments or the second plurality of radial groove segments includes straight-line groove segments (e.g., the radial groove segments of FIG. 3A).

In a fourth implementation, alone or in combination with one or more of the first through third implementations, at least one of the first plurality of radial groove segments or the second plurality of radial groove segments include curved-line groove segments (e.g., the first plurality of radial groove segments 314A-314C, or the second plurality of radial groove segments 316A-316C).

In a fifth implementation, alone or in combination with one or more of the first through fourth implementations, at least one of the first plurality of radial groove segments or the second plurality of radial groove segments includes groove segment sidewalls (e.g., the groove segment sidewalls 514 or 534) that include a step (e.g., the step 504 or 524), wherein the step separates an upper groove segment portion (e.g., the upper groove segment portion 506 or 526) with a first groove segment width (e.g., the first groove segment width 510 or 530), and lower groove segment portion (e.g., the lower groove segment portion 508 or 528) with a second groove segment width (e.g., the second groove segment width 512 or 532), wherein the lower groove segment portion is adjacent to a pad base (e.g., the pad base 248) of the polishing pad 204, and wherein the upper groove segment portion is adjacent to a polishing surface 206 of the polishing pad 204.

In a sixth implementation, alone or in combination with one or more of the first through fifth implementations, the first groove segment width (e.g., the first groove segment width 510) is greater than the second groove segment width (e.g., the second groove segment width 512).

In a seventh implementation, alone or in combination with one or more of the first through sixth implementations, the second groove segment width (e.g., the second groove segment width 532) is greater than the first groove segment width (e.g., the first groove segment width 530).

In an eighth implementation, alone or in combination with one or more of the first through seventh implementations, at least one of the first plurality of radial groove segments or the second plurality of radial groove segments includes groove segment sidewalls (e.g., the groove segment sidewalls 604), and wherein the groove segment sidewalls include an angled top edge (e.g., the angled top edge 608) between the groove segment sidewalls and a polishing surface 206 of the polishing pad 204.

Although FIG. 9 shows example blocks of process 900, in some implementations, process 900 may include additional blocks, fewer blocks, different blocks, or differently arranged blocks than those depicted in FIG. 9. Additionally, or alternatively, two or more of the blocks of process 900 may be performed in parallel.

Figure 10:
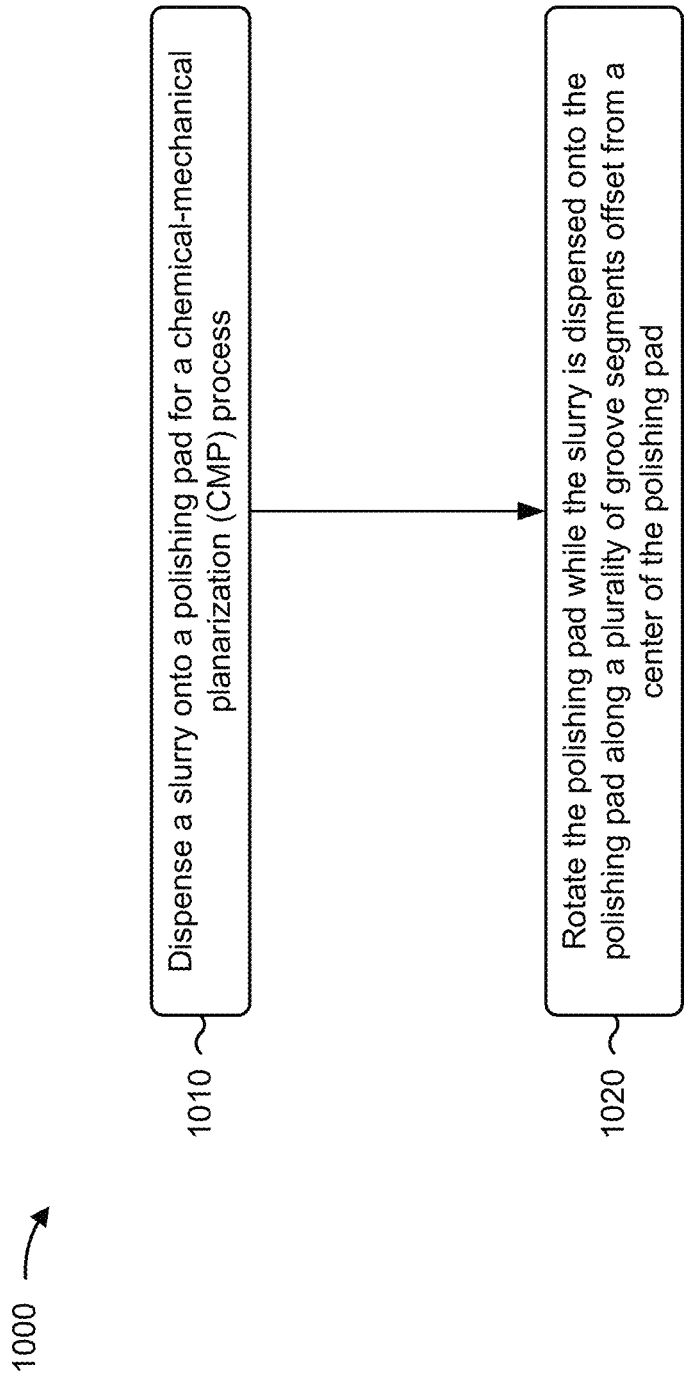
FIG. 10 is a flowchart of an example of a process relating to a CMP process described herein.

FIG. 10 is a flowchart of an example of a process 1000 relating to a CMP process described herein. In some implementations, one or more process blocks of FIG. 10 may be performed by a CMP system or a CMP tool (e.g., a CMP system 100 or a CMP tool 200). In some implementations, one or more process blocks of FIG. 10 may be performed by another device or a group of devices separate from or including the CMP system or the CMP tool. Additionally, or alternatively, one or more process blocks of FIG. 10 may be performed by one or more components of device 800, such as processor 820, memory 830, input component 840, output component 850, and/or communication component 860.

As shown in FIG. 10, process 1000 may include dispensing a slurry onto a polishing pad for a chemical-mechanical planarization (CMP) process (block 1010). For example, the CMP system 100 or the CMP tool 200 may dispense a slurry onto a polishing pad 204 for a chemical-mechanical planarization (CMP) process, as described above.

As further shown in FIG. 10, process 1000 may include rotating the polishing pad while the slurry is dispensed onto the polishing pad along a plurality of groove segments offset from a center of the polishing pad (block 1020). For example, the CMP system 100 or the CMP tool 200 may rotate the polishing pad 204 while the slurry 238 is dispensed onto the polishing pad 204. Rotation of the polishing pad 204 results in the slurry 238 traversing the polishing pad 204 radially outward toward a polishing pad outer edge 246. The polishing pad 204 includes a plurality of groove segments (e.g., the groove segments 410A-410F, 430A-430C, 450A-450D, and/or 470A-470D). Subsets of the plurality of groove segments join to form a repeating pattern of polygons (e.g., the polygons 412A-412D, 432A-432D, 452A-452D, and/or 472A-472D) in portions of the polishing pad 204 between the plurality of groove segments. The plurality of groove segments are offset from a center (e.g., the center 244, 402, 422, 442, or 462) of the polishing pad 204.

Process 1000 may include additional implementations, such as any single implementation or any combination of implementations described below and/or in connection with one or more other processes described elsewhere herein.

In a first implementation, the repeating pattern of polygons (e.g., the polygons 412A-412D, 432A-432D, 452A-452D, and/or 472A-472D) includes at least one of a repeating pattern of triangles, a repeating pattern of rectangles, a repeating pattern of parallelograms, or a repeating pattern of hexagons.

In a second implementation, alone or in combination with the first implementation, the plurality of groove segments (e.g., the groove segments of 4A, 4B, 4C, and/or 4D) are angularly offset from a radius (e.g., the radius 404, 424, or 464) of the polishing pad 204 to impede radial flow of the slurry 238 on the polishing pad 204.

In a third implementation, alone or in combination with one or more of the first and second implementations, the one polygon of the repeating pattern of polygons (e.g., one of the polygons of FIG. 4A, 4B, 4C or 4D) encompasses the center (e.g., the center 244, 402, 422, 442, or 462) of the polishing pad 204.

In a fourth implementation, alone or in combination with one or more of the first through third implementations, the plurality of groove segments (e.g., the groove segments of 4A, 4B, 4C, and/or 4D) include groove segment sidewalls (e.g., the groove segment sidewalls 514 or 534) that include a step (e.g., the step 504 or 524), wherein the step separates an upper groove segment portion (e.g., the upper groove segment portion 506 or 526) with a first groove segment width (e.g., the first groove segment width 510 or 530), and lower groove segment portion (e.g., the lower groove segment portion 508 or 528) with a second groove segment width (e.g., the second groove segment width 512 or 532), wherein the lower groove segment portion is adjacent to a pad base (e.g., the pad base 248) of the polishing pad 204, wherein the upper groove segment portion is adjacent to a polishing surface 206 of the polishing pad 204, and wherein one of the first groove segment width or the second groove segment width is larger than another one of the first groove segment width or the second groove segment width.

In a fifth implementation, alone or in combination with one or more of the first through fourth implementations, the plurality of groove segments (e.g., the groove segments of 4A, 4B, 4C, and/or 4D) include groove segment sidewalls (e.g., the groove segment sidewalls 604), and wherein the groove segment sidewalls include an angled top edge (e.g., the angled top edge 608) between the groove segment sidewalls and a polishing surface 206 of the polishing pad 204.

Although FIG. 10 shows example blocks of process 1000, in some implementations, process 1000 may include additional blocks, fewer blocks, different blocks, or differently arranged blocks than those depicted in FIG. 10. Additionally, or alternatively, two or more of the blocks of process 1000 may be performed in parallel.

Some implementations described herein include CMP techniques and apparatuses that use a polishing pad having geometric patterns formed by a plurality of groove segments. The geometric patterns formed by the plurality of groove segments promotes a uniform flow of the slurry during polishing of the semiconductor wafer. As described herein, all or a portion of the plurality of groove segments and/or geometric patterns formed by the plurality of groove segments are configured so that all or a portion of the plurality of groove segments and/or geometric pattern formed by the plurality of groove segments impede the slurry trajectory. By impeding the slurry trajectory, a retention time or duration of time the slurry is present on the polishing pad is increased. Such an increase in the retention time of the slurry results in lower slurry consumption and, therefore, lower operating costs. Further, the uniform flow of the slurry improves the polishing such that the WiZ thickness of the semiconductor wafer satisfies the uniformity threshold, which reduces (or eliminates) defects that negatively impact yield and electrical performance of an integrated circuit device on the semiconductor wafer.

As described in greater detail above, some implementations described herein provide a method. The method includes dispensing a slurry onto a polishing pad for a chemical-mechanical planarization (CMP) process. The method includes rotating the polishing pad while the slurry is dispensed onto the polishing pad, where rotation of the polishing pad results in a traversal of the slurry radially outward toward a polishing pad outer edge of the polishing pad, where the polishing pad further includes thereon a first concentric groove segment, where the polishing pad further includes thereon a second concentric groove segment located between the first concentric groove segment and the polishing pad outer edge, where the polishing pad further includes thereon a third concentric groove segment located between the second concentric groove segment and the polishing pad outer edge, where the polishing pad includes a first plurality of radial groove segments extending between the first concentric groove segment and the second concentric groove segment, where the polishing pad further includes a second plurality of radial groove segments extending between the second concentric groove segment and the third concentric groove segment, and where the first plurality of radial groove segments are radially staggered from the second plurality of radial groove segments.

As described in greater detail above, some implementations described herein provide a method. The method includes dispensing a slurry onto a polishing pad for a chemical-mechanical planarization (CMP) process. The method includes rotating the polishing pad while the slurry is dispensed onto the polishing pad, where rotation of the polishing pad results in the slurry traversing the polishing pad radially outward toward a polishing pad outer edge, where the polishing pad includes a plurality of groove segments, where subsets of the plurality of groove segments join to form a repeating pattern of polygons in portions of the polishing pad between the plurality of groove segments, and where the plurality of groove segments are offset from a center of the polishing pad.

As described in greater detail above, some implementations described herein provide a polishing pad. The polishing pad includes a pad base. The polishing pad includes a groove layer, wherein the groove layer is configured to receive slurry for performing a chemical-mechanical planarization (CMP) process, where the groove layer includes a groove region located between a center and a polishing pad outer edge of the polishing pad, where the groove region includes a plurality of groove segments, and where the plurality of groove segments are non-linear along a radius of the polishing pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   dispensing a slurry onto a polishing pad for a chemical-mechanical planarization (CMP) process; and
   rotating the polishing pad while the slurry is dispensed onto the polishing pad,
      wherein rotation of the polishing pad results in a traversal of the slurry radially outward toward a polishing pad outer edge of the polishing pad, and
      wherein the polishing pad includes:
         a first concentric groove segment,
         a second concentric groove segment located between the first concentric groove segment and the polishing pad outer edge, a third concentric groove segment located between the second concentric groove segment and the polishing pad outer edge, a first plurality of radial groove segments extending between the first concentric groove segment and the second concentric groove segment, and a second plurality of radial groove segments extending between the second concentric groove segment and the third concentric groove segment, wherein the first plurality of radial groove segments are radially staggered from the second plurality of radial groove segments, and wherein at least one of a first radial groove segment, of the first plurality of radial groove segments, or a second radial groove segment, of the second plurality of radial groove segments, includes groove segment sidewalls that each includes a step separating an upper groove segment portion, adjacent to a polishing surface of the polishing pad, and a lower groove segment portion, exposing a pad base of the polishing pad, wherein the lower groove segment portion is offset from the upper groove segment portion, and wherein a width of the upper groove segment portion is less than a width of the lower groove segment portion.

2. The method of claim 1, wherein the first plurality of radial groove segments being radially staggered from the second plurality of radially groove segments provides resistance to the traversal of the slurry radially outward toward the polishing pad outer edge.

3. The method of claim 1, wherein the polishing pad further includes:
a third plurality of radial groove segments extending between the third concentric groove segment and the polishing pad outer edge.

4. The method of claim 1, wherein at least one of the first plurality of radial groove segments or the second plurality of radial groove segments includes straight-line groove segments.

5. The method of claim 1, wherein at least one of the first plurality of radial groove segments or the second plurality of radial groove segments include curved-line groove segments.

6. The method of claim 1, wherein the groove segment sidewalls include an angled top edge between the groove segment sidewalls and the polishing surface.

7. The method of claim 6, wherein the angled top edge is in a range of 0 degrees to 5 degrees.

8. The method of claim 1, wherein:
the first plurality of radial groove segments are equally spaced from each other between the first concentric groove segment and the second concentric groove segment,
the second plurality of radial groove segments are equally spaced from each other between the second concentric groove segment and the third concentric groove segment, and
a quantity of the first plurality of radial groove segments is different than a quantity of the second plurality of radial groove segments.

9. A method, comprising:
dispensing a slurry onto a polishing pad for a chemical-mechanical planarization (CMP) process; and
rotating the polishing pad while the slurry is dispensed onto the polishing pad,
wherein rotation of the polishing pad results in the slurry traversing the polishing pad radially outward toward a polishing pad outer edge, and
wherein the polishing pad includes a plurality of groove segments, offset from a center of the polishing pad, comprising segments joining to form a repeating pattern of polygons in portions of the polishing pad between the plurality of groove segments,
wherein at least one of the segments of the plurality of groove segments includes groove segment sidewalls that each includes a step separating an upper groove segment portion, adjacent to a polishing surface of the polishing pad, and a lower groove segment portion, exposing a pad base of the polishing pad,
wherein the lower groove segment portion is offset from the upper groove segment portion, and
wherein a width of the upper groove segment portion is less than a width of the lower groove segment portion.

10. The method of claim 9, wherein the repeating pattern of polygons includes a repeating pattern of triangles.

11. The method of claim 9, wherein the plurality of groove segments are angularly offset from a radius of the polishing pad to impede radial flow of the slurry on the polishing pad.

12. The method of claim 9, wherein one polygon of the repeating pattern of polygons encompasses the center of the polishing pad.

13. The method of claim 9, wherein the groove segment sidewalls include an angled top edge between the groove segment sidewalls and the polishing surface.

14. A polishing pad, comprising:
a pad base; and
a groove layer, configured to receive slurry for performing a chemical-mechanical planarization (CMP) process, including a groove region, located between a center and a polishing pad outer edge of the polishing pad, including a plurality of groove segments that are non-linear along a radius of the polishing pad,
wherein at least one of the plurality of groove segments includes groove segment sidewalls that each includes a step separating an upper groove segment portion, adjacent to a polishing surface of the polishing pad, and a lower groove segment portion, exposing a pad base of the polishing pad,
wherein a width of the upper groove segment portion is less than a width of the lower groove segment portion, and
wherein the lower groove segment portion is perpendicular to the polishing surface.

15. The polishing pad of claim 14, wherein the plurality of groove segments comprises:
a first concentric groove segment located between the center of the polishing pad and the polishing pad outer edge;
a second concentric groove segment located between the first concentric groove segment and the polishing pad outer edge;
a third concentric groove segment located between the second concentric groove segment and the polishing pad outer edge;
a first plurality of radial groove segments extending between the first concentric groove segment and the second concentric groove segment; and a second plurality of radial groove segments extending between the second concentric groove segment and the third concentric groove segment,
wherein the first plurality of radial groove segments are radially staggered from the second plurality of radial groove segments.

16. The polishing pad of claim 15, wherein each of the first concentric groove segment, the second concentric groove segment, and the third concentric groove segment includes the groove segment sidewalls.

17. The polishing pad of claim 15, wherein each of the first plurality of radial groove segments and the second plurality of radial groove segments includes the groove segment sidewalls.

18. The polishing pad of claim 14, wherein at least a subset of the plurality of groove segments forms a repeating pattern of polygons on at least a portion of the polishing pad.

19. The polishing pad of claim 14, wherein the groove segment sidewalls include an angled top edge between the groove segment sidewalls and the polishing surface.

20. The polishing pad of claim 19, wherein the angled top edge is in a range of 0 degrees to 5 degrees.

* * * * *